(12) United States Patent
Liu et al.

(10) Patent No.: US 11,302,822 B2
(45) Date of Patent: Apr. 12, 2022

(54) THIN FILM TRANSISTOR AND FABRICATION METHOD THEREOF, ARRAY SUBSTRATE AND FABRICATION METHOD THEREOF

(71) Applicant: BOE TECHNOLOGY GROUP CO., LTD., Beijing (CN)

(72) Inventors: Fengjuan Liu, Beijing (CN); Donghui Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 202 days.

(21) Appl. No.: 16/618,941

(22) PCT Filed: May 30, 2019

(86) PCT No.: PCT/CN2019/089295
§ 371 (c)(1),
(2) Date: Dec. 3, 2019

(87) PCT Pub. No.: WO2019/228457
PCT Pub. Date: Dec. 5, 2019

(65) Prior Publication Data
US 2021/0328071 A1  Oct. 21, 2021

(30) Foreign Application Priority Data
Jun. 1, 2018 (CN) .......................... 201810558748.1

(51) Int. Cl.
*H01L 29/786* (2006.01)
*H01L 27/32* (2006.01)
(Continued)

(52) U.S. Cl.
CPC .... *H01L 29/78633* (2013.01); *H01L 27/3244* (2013.01); *H01L 29/66553* (2013.01); *H01L 29/78675* (2013.01); *H01L 51/56* (2013.01)

(58) Field of Classification Search
CPC .............. H01L 29/78633; H01L 51/56; H01L 27/3244; H01L 29/66553; H01L 29/78675
See application file for complete search history.

(56) References Cited

U.S. PATENT DOCUMENTS 9,660,090 B2  5/2017  Yoon
10,636,816 B2  4/2020  Gao et al.
(Continued)

FOREIGN PATENT DOCUMENTS

CN  103529608  1/2014
CN  104752436  7/2015
(Continued)

OTHER PUBLICATIONS

Chinese Office Action dated Aug. 4, 2020 corresponding to Chinese Patent Application No. 201810558748.1; 24 pages.
(Continued)

*Primary Examiner* — Karen Kusumakar
*Assistant Examiner* — Adam S Bowen
(74) *Attorney, Agent, or Firm* — Leason Ellis LLP

(57) ABSTRACT

A thin film transistor and a fabrication method thereof, an array substrate and a fabrication method thereof are disclosed. The thin film transistor includes: a base substrate; a gate electrode, an active layer, a source electrode and a drain electrode on the base substrate; and the thin film transistor further includes: a light-shielding portion between the active layer and the base substrate, the light-shielding portion includes a groove, and the active layer is in the groove.

18 Claims, 19 Drawing Sheets

(51) Int. Cl.
*H01L 29/66* (2006.01)
*H01L 51/56* (2006.01)

(56) References Cited

U.S. PATENT DOCUMENTS

| | | | | |
|---|---|---|---|---|
| 2002/0071073 | A1* | 6/2002 | Sekine | G02F 1/1368 |
| | | | | 349/110 |
| 2014/0008656 | A1* | 1/2014 | Shim | H01L 29/66765 |
| | | | | 257/59 |
| 2014/0131713 | A1* | 5/2014 | Lee | H01L 27/1288 |
| | | | | 257/59 |
| 2016/0071834 | A1* | 3/2016 | Zhang | H01L 29/41733 |
| | | | | 257/72 |
| 2016/0077397 | A1 | 3/2016 | Kim et al. | |
| 2016/0254283 | A1* | 9/2016 | Shen | H01L 27/1248 |
| | | | | 257/72 |
| 2016/0307985 | A1 | 10/2016 | Beak et al. | |
| 2016/0359053 | A1* | 12/2016 | Wang | H01L 29/78696 |
| 2017/0052418 | A1* | 2/2017 | Zhang | H01L 27/1285 |
| 2017/0110488 | A1* | 4/2017 | Sun | H01L 29/78621 |

FOREIGN PATENT DOCUMENTS

| | | |
|---|---|---|
| CN | 104752637 | 7/2015 |
| CN | 106876386 | 6/2017 |
| CN | 107507867 | 12/2017 |
| CN | 108807549 | 11/2018 |
| JP | 2000164875 | 6/2000 |
| JP | 3230669 | 11/2001 |
| JP | 2011003650 | 1/2011 |

OTHER PUBLICATIONS

Chinese Office Action dated Sep. 29, 2019 corresponding to Chinese Patent Application No. 201810558748.1 ; 23 pages.

\* cited by examiner

THIN FILM TRANSISTOR AND FABRICATION METHOD THEREOF, ARRAY SUBSTRATE AND FABRICATION METHOD THEREOF

CROSS REFERENCE TO RELATED APPLICATIONS

This application is a U.S. National Stage Application under 35 U.S.C. § 371 of International Patent Application No. PCT/CN2019/089295, filed May 30, 2019, which claims priority to Chinese patent application No. 201810558748.1 filed on Jun. 1, 2018, both of which are incorporated herein by reference in their entireties as part of the present application.

TECHNICAL FIELD

Embodiments of the present disclosure relate to a thin film transistor and a fabrication method thereof, an array substrate comprising the thin film transistor and a fabrication method thereof.

BACKGROUND

At present, an organic light-emitting diode (OLED) array substrate is generally not shielded from light or uses a metallic light shield at its rear side. However, the metallic light shield can only shield light incident from rear side of the array substrate, but cannot shield light incident from a lateral side of the array substrate. Moreover, the incident light is reflected multiple times between respective layers on a base substrate, and is easily incident into a channel of an active layer from a side surface of the active layer, thus affecting performance of a thin film transistor.

SUMMARY

Embodiments of the present disclosure relate to a thin film transistor and a fabrication method thereof, an array substrate comprising the thin film transistor and a fabrication method thereof.

In first aspect of the present disclosure, it is provided a thin film transistor. The thin film transistor comprises: a base substrate; a gate electrode, an active layer, a source electrode and a drain electrode on the base substrate; and a light-shielding portion between the active layer and the base substrate, the light-shielding portion comprising a groove, and the active layer being in the groove.

In at least some embodiments, a side wall of the groove is on a periphery of the active layer.

In at least some embodiments, the light-shielding portion comprises a spacer layer and a light-shielding layer on the spacer layer, and the groove is in the light-shielding layer.

In at least some embodiments, the spacer layer is configured to define an opening, and the light-shielding layer at least overlays a bottom portion and a side wall of the opening.

In at least some embodiments, the spacer layer and the light-shielding layer are made of a same material and integrally formed.

In at least some embodiments, a distance between a topmost surface of the light-shielding portion that is away from the base substrate and the base substrate is greater than or equal to a distance between a surface of the active layer that is away from the base substrate and the base substrate.

In second aspect of the present disclosure, it is provided a fabrication method of a thin film transistor. The fabrication method comprises: providing a base substrate; forming a gate electrode, an active layer, a source electrode and a drain electrode on the base substrate; forming a light-shielding portion between the active layer and the base substrate, the light-shielding portion comprising a groove, and the active layer being formed in the groove.

In at least some embodiments, the forming a light-shielding portion between the active layer and the base substrate comprises: forming a light-shielding thin film; and patterning the light-shielding thin film to form the light-shielding portion comprising the groove, a side wall of the groove being on a periphery of the active layer.

In at least some embodiments, the forming a light-shielding portion between the active layer and the base substrate comprises: forming a spacer layer that defines an opening on the base substrate; and forming a light-shielding layer on the spacer layer, the groove being formed in the light-shielding layer; the light-shielding layer overlays at least a bottom portion and a side wall of the opening, and the side wall of the opening is on the periphery of the active layer.

In third aspect of the present disclosure, it is provided an array substrate, which comprises the afore-mentioned thin film transistor.

In at least some embodiments, the array substrate further comprises: a plurality of gate lines and a plurality of data lines on the base substrate, wherein the plurality of gate lines and the plurality of data lines intersect with each other to define a plurality of sub-areas, and the plurality of sub-areas comprise at least one pixel area provided with the thin film transistor; the thin film transistor comprises a first thin film transistor and a second thin film transistor, the first thin film transistor comprises a first active layer and a common light-shielding portion located between the first active layer and the base substrate, the common light-shielding portion comprises a common groove; the second thin film transistor comprises a second active layer; the common light-shielding portion extends between the second active layer and the base substrate, such that the first active layer and the second active layer are both in the common groove.

In at least some embodiments, a side wall of the common groove is on a periphery of both the first active layer and the second active layer.

In at least some embodiments, the at least one pixel area is further provided with an organic light-emitting diode component; the organic light-emitting diode component comprises a first electrode, a second electrode, and a pixel defining layer between the first electrode and the second electrode; and the pixel defining layer is configured to separate adjacent two organic light-emitting diode components; the side wall of the common groove is in an area corresponding to the pixel defining layer, such that an orthographic projection of the common light-shielding portion on the base substrate at least partially overlaps an orthographic projection of the pixel defining layer on the base substrate.

In at least some embodiments, the common light-shielding portion comprises a common spacer layer and a common light-shielding layer on the common spacer layer; the common groove is formed in the common light-shielding layer; an orthographic projection of the common spacer layer on the base substrate is located in the orthographic projection of the pixel defining layer on the base substrate.

In at least some embodiments, the plurality of sub-areas further comprise at least one non-pixel area, and the at least one non-pixel area is provided only with a buffer layer.

In third aspect of the present disclosure, it is provided a fabrication method of an array substrate, the fabrication method comprises: forming a plurality of gate lines and a plurality of data lines on a base substrate, wherein the plurality of gate lines and the plurality of data lines intersect with each other to define a plurality of sub-areas, and the plurality of sub-areas comprise at least one pixel area and at least one non-pixel area; and forming a first thin film transistor and a second thin film transistor in the at least one pixel area, wherein the first thin film transistor comprises a first active layer and a common light-shielding portion between the first active layer and the base substrate, the common light-shielding portion comprises a common groove, and wherein the second thin film transistor comprises a second active layer, the common light-shielding portion extends between the second active layer and the base substrate, such that the first active layer and the second active layer are both in the common groove.

In at least some embodiments, the fabrication method further comprises: forming an organic light-emitting diode component in the at least one pixel area, wherein the organic light-emitting diode component comprises a first electrode, a second electrode, and a pixel defining layer located between the first electrode and the second electrode, and the pixel defining layer is configured to separate adjacent two organic light-emitting diode components, and wherein a side wall of the common groove is in an area corresponding to the pixel defining layer, such that an orthographic projection of the common light-shielding portion on the base substrate at least partially overlaps an orthographic projection of the pixel defining layer on the base substrate.

In at least some embodiments, the forming the common light-shielding portion comprises: forming a common spacer layer on the base substrate, an orthographic projection of the common spacer layer on the base substrate being in the orthographic projection of the pixel defining layer on the base substrate; forming a common light-shielding layer on the common spacer layer; and forming a common groove in the common light-shielding layer.

In at least some embodiments, after the forming the common light-shielding portion, the fabrication method further comprises: forming a buffer layer simultaneously in the at least one pixel area and the at least one non-pixel area, wherein the first thin film transistor, the second thin film transistor and the organic light-emitting diode component are formed on the buffer layer of the at least one pixel area, and only the buffer layer is reserved in the non-pixel area.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
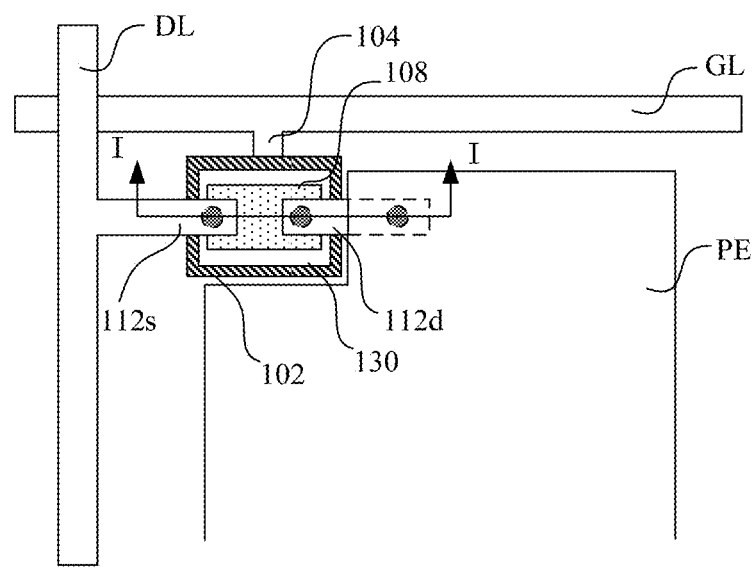
FIG. 1 is a structural schematic diagram of a thin film transistor according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

It should be noted that, in all the embodiments of the present disclosure, various directions are designated with reference to a base substrate in a thin film transistor. For example, with an active layer as an example, an "upper surface" of the active layer refers to a surface of the active layer that is away from the base substrate, and a "lower surface" of the active layer refers to a surface of the active layer that is close to the base substrate, a "side surface" of the active layer is a surface sandwiched between the upper surface and the lower surface. When the "upper surface" of the active layer is not located in a same horizontal plane, a "topmost surface" of the active layer refers to an upper surface farthest away from the base substrate. In addition, the term "groove" used in the embodiments of the present disclosure refers to a blind hole, that is, a hole that does not penetrate a layer in which the groove is located, and the term "opening" may be a blind hole or a via hole.

An embodiment of the present disclosure provides a thin film transistor, comprising: a base substrate; a gate electrode, an active layer, a source electrode and a drain electrode located on the base substrate; the thin film transistor further comprising a light-shielding portion located between the active layer and the base substrate, herein, the light-shielding portion includes a groove, and the active layer is located in the groove.

In the above-described thin film transistor, by providing the active layer in the groove of the light-shielding portion, light incident onto a side surface of the active layer can be reduced or even shielded, so as to reduce a leakage current caused by photo-generated carriers, and avoid an influence on performance of the thin film transistor.

Figure 2:
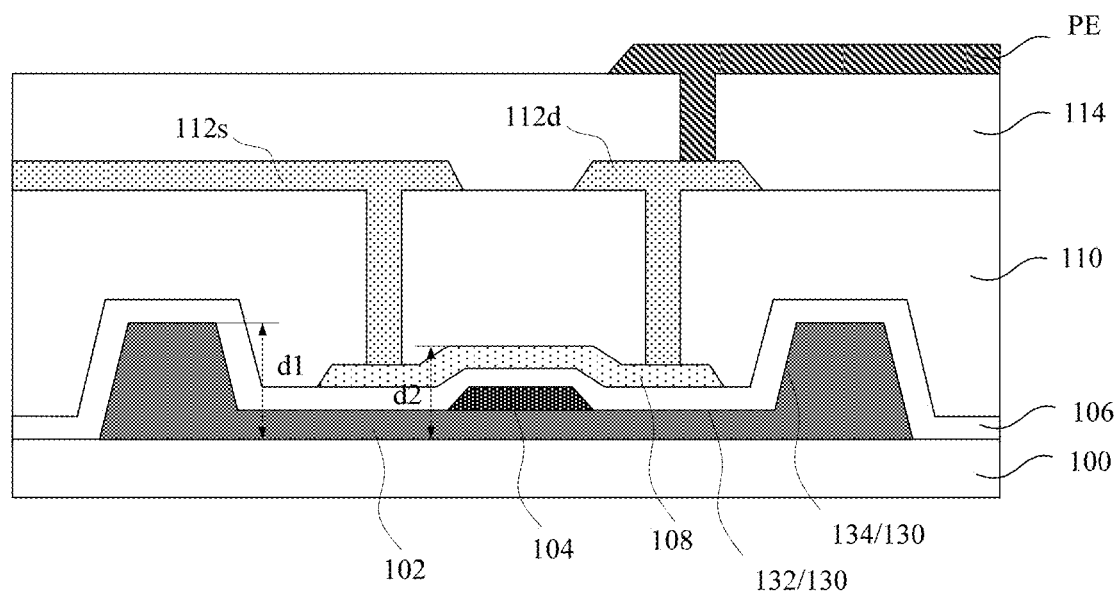
FIG. 2 is a cross-sectional view taken along line I-I of FIG. 1.

FIG. 1 is a structural schematic diagram of a thin film transistor according to an embodiment of the present disclosure, and FIG. 2 is a cross-sectional view taken along line I-I of FIG. 1. As illustrated in FIG. 1 and FIG. 2, a plurality of gate lines GL and a plurality of data lines DL are provided on a base substrate, and the plurality of gate lines GL and the plurality of data lines DL intersect with each other to define a plurality of pixel units, and each pixel unit includes at least one thin film transistor. The thin film transistor comprises: a base substrate 100; a gate electrode 104, an active layer 108, a source electrode 112s and a drain electrode 112d located on the base substrate 100. The thin film transistor further comprises a light-shielding portion 102 located between the active layer 108 and the base substrate 100, the light-shielding portion 102 includes a groove 130, and the active layer 108 is located in the groove 130.

In the above-described thin film transistor, by arranging the active layer 108 in the groove 130 of the light-shielding portion 102, light incident onto a side surface of the active layer 108 can be reduced or even shielded, so as to reduce a leakage current caused by photo-generated carriers, and avoid an influence on performance of the thin film transistor.

It should be noted that, providing the light-shielding portion 102 to shield light from irradiating onto the side surface of the active layer 108 includes: providing the light-shielding portion 102 such that at least a portion of the side surface of the active layer 108 is not irradiated by light; or providing the light-shielding portion 102 such that the entire side surface of the active layer 108 is not irradiated by light.

For example, the thin film transistor further comprises a film layer such as a gate insulating layer 106, a first dielectric layer 110, a second dielectric layer 114 and a pixel electrode PE. The gate electrode 104 is connected with the gate line GL, and the data line DL is connected with the source electrode 112s. The source electrode 112s is connected with the active layer 108 through a first contact hole located in the first dielectric layer 110; the drain electrode 112d has one end connected with the active layer 108 through a second contact hole located in the first dielectric layer 110, and the other end connected with the pixel electrode PE through a third contact hole located in the second dielectric layer 114.

Figure 3A:
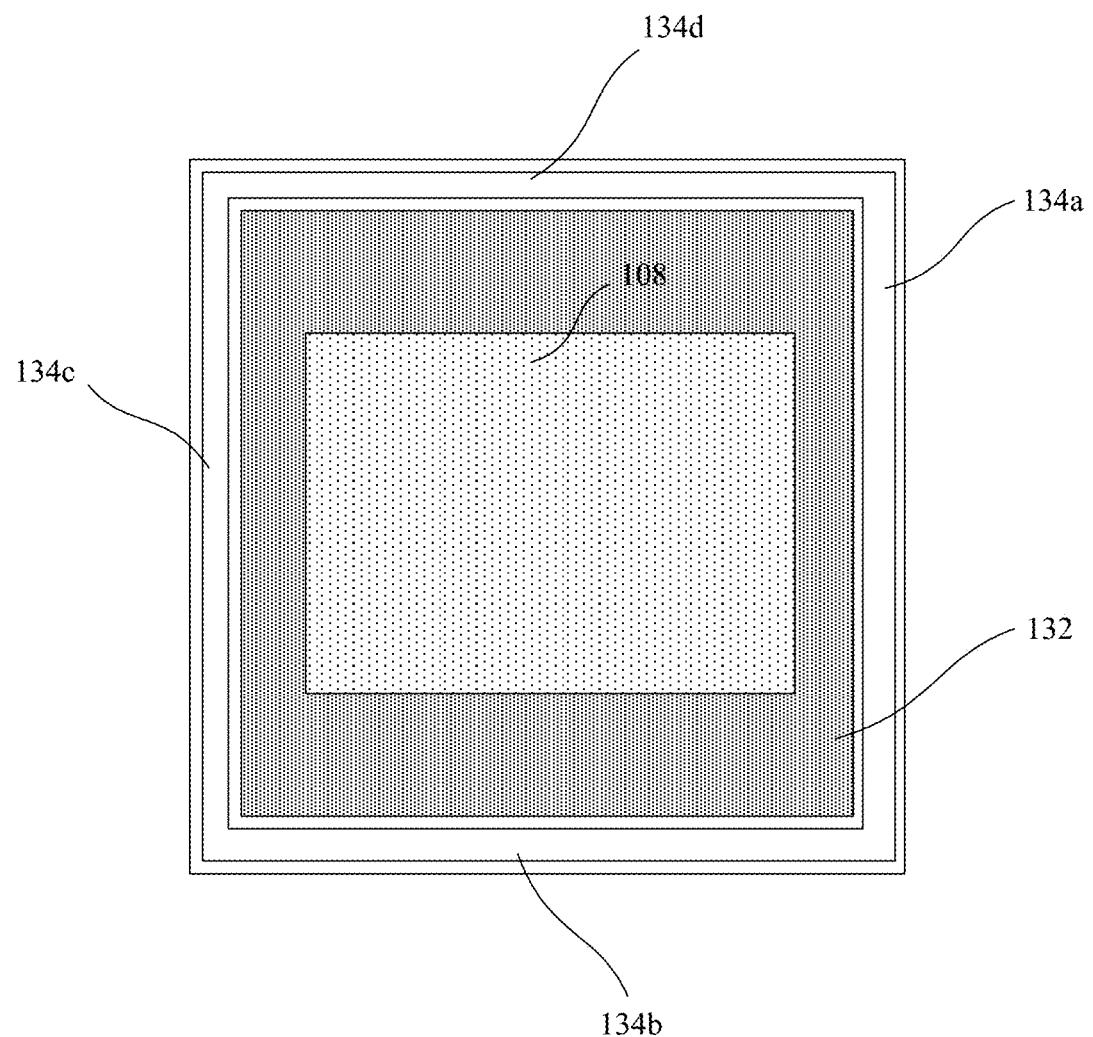
FIG. 3(a) is a structural schematic diagram of a light-shielding portion and an active layer according to the embodiment of the present disclosure.

For example, the groove 130 includes a bottom portion 132 and a side wall 134, herein, the side wall 134 is located on a periphery of the active layer 108 and constitutes a dam structure. For example, FIG. 3(a) is a structural schematic diagram of the light-shielding portion and the active layer according to an embodiment of the present disclosure. As illustrated in FIG. 3(a), the groove 130 includes a bottom portion 132 and four side walls 134a, 134b, 134c, 134d. The four side walls 134a to 134d are connected head to tail to form a dam structure. The four side walls 134 are connected with the bottom portion 132 and surround the periphery of the active layer 108. The bottom portion 132 is configured to shield light incident from a rear side of the base substrate

100 (for example, light emitted from a backlight source), and the dam structure can shield light incident onto the side surface of the active layer 108. In this way, the groove 130 according to the embodiment of the present disclosure can further effectively prevent light incident onto the active layer 108 from various directions, so as to avoid an influence on performance of the thin film transistor.

Figure 3B:
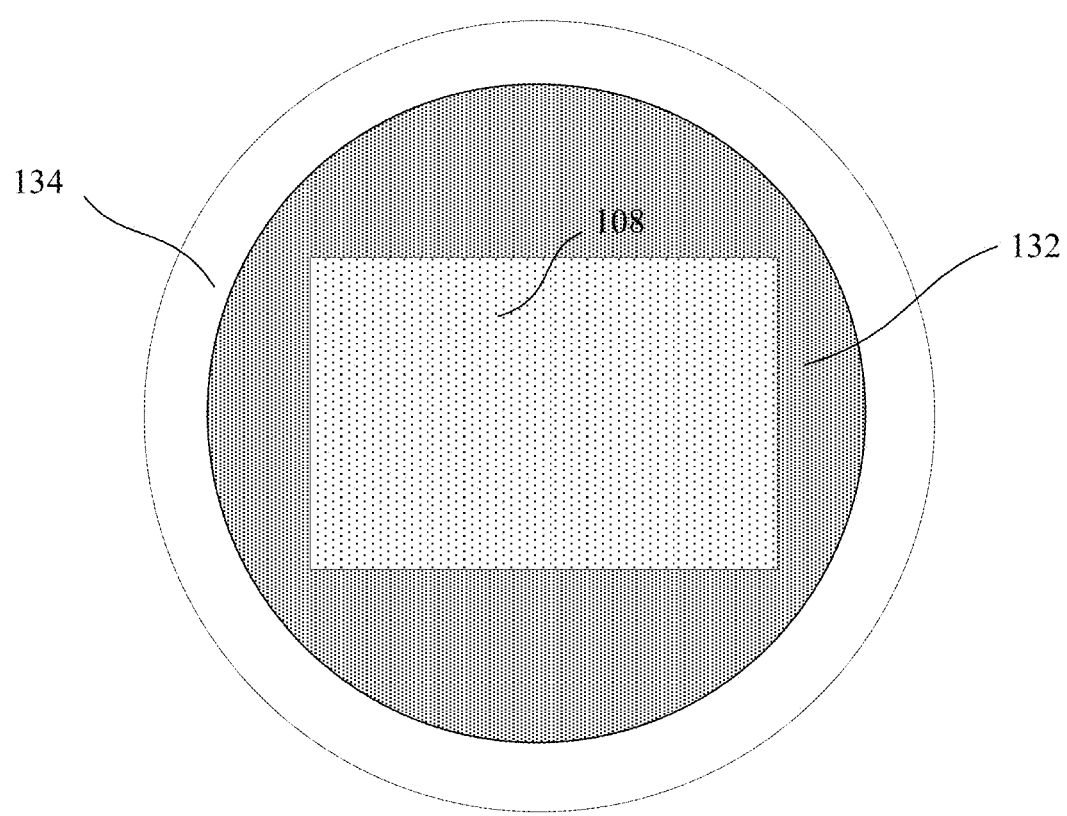
FIG. 3(b) is a structural schematic diagram of a light-shielding portion and an active layer according to another embodiment of the present disclosure.

It can be understood that, a cross-sectional shape of the dam structure in a plane parallel to a plane where the base substrate 100 is located is not limited to a rectangular loop illustrated in FIG. 3(*a*). In other embodiments, the cross-sectional shape of the dam structure may be a regular shape, such as a circular loop, an elliptical loop and a polygonal loop, or other irregular shape; a shape and a size thereof may be determined according to factors such as a shape and an area of an active layer. FIG. 3(*b*) is a structural schematic diagram of a light-shielding portion and an active layer according to another embodiment of the present disclosure. A groove 130 includes a circular bottom portion 132 and an annular side wall 134; the side wall 134 is connected with the bottom portion 132 and surrounds the active layer 108. The annular side wall 134 has an equal thickness at any position, so that a relatively uniform light-shielding effect in various directions can be achieved. In other embodiments, a thickness of a side wall may also be unequal, which can also prevent light incident onto the active layer 108 from various directions.

Figure 4:
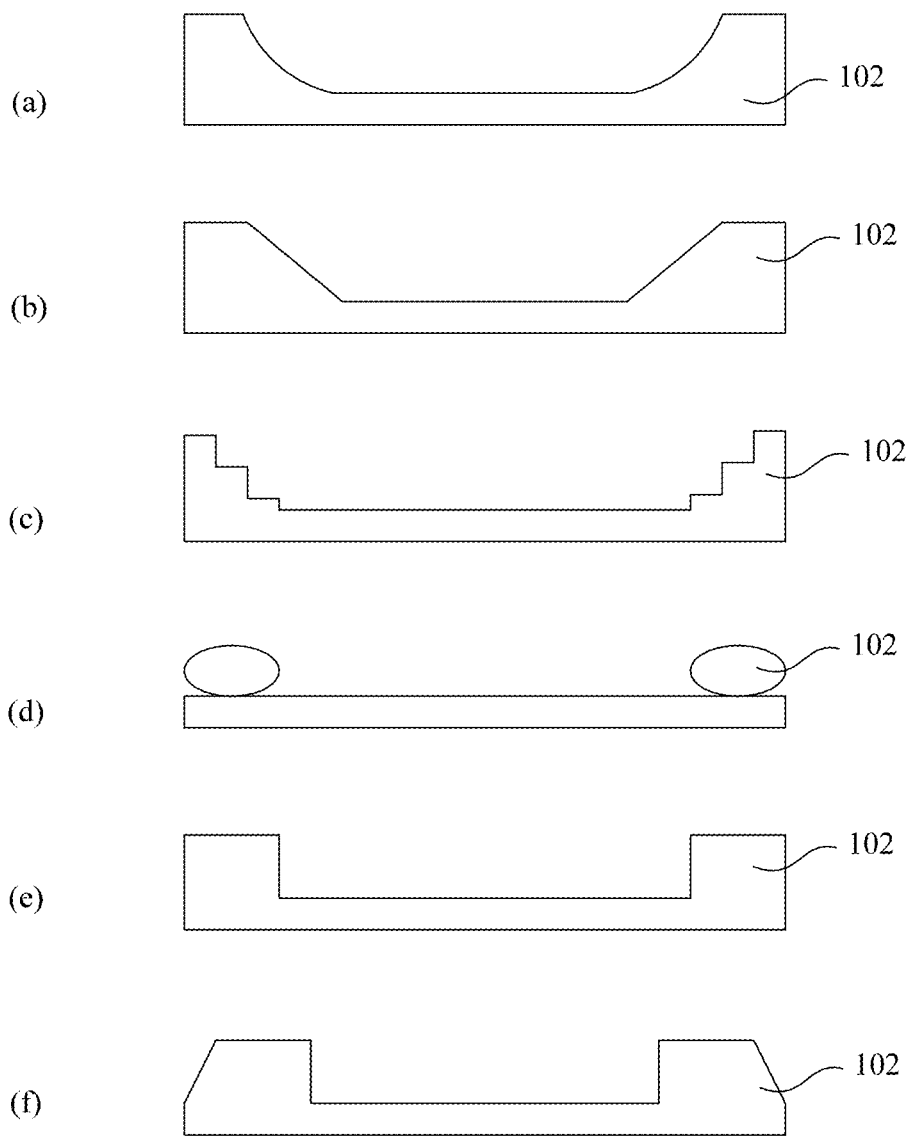
FIG. 4(a) to FIG. 4(f) illustrate a plurality of examples of the light-shielding portion according to embodiments of the present disclosure.

In addition, it can be understood that, a cross-sectional shape of the dam structure in a plane perpendicular to the plane where the base substrate 100 is located is not limited to an isosceles trapezoid illustrated in FIG. 2. FIG. 4(*a*) to FIG. 4(*f*) illustrate a plurality of examples of the light-shielding portion according to embodiments of the present disclosure. The cross-sectional shape of the dam structure in the plane perpendicular to the plane where the base substrate 100 is located may be a regular shape such as a rectangle, an ellipse and an ordinary trapezoid, or any other irregular shape. In addition, inner and outer surfaces of the dam structure may have a same shape or may also have different shapes. For example, the inner surface of the dam structure includes a vertical surface perpendicular to a plane where the base substrate is located (as illustrated in FIG. 4(*e*) to FIG. 4(*f*)), a sloped surface inclined with respect to the plane where the base substrate is located (as illustrated in FIG. 4(*b*)), a convex surface (as illustrated in FIG. 4(*d*)), a concave surface (as illustrated in FIG. 4(*a*)), or a stepped surface (as illustrated in FIG. 4(*c*)), etc. Similarly, the outer surface of the dam structure includes a vertical surface, a sloped surface, a convex surface, a concave surface or a stepped surface. In the embodiment of the present disclosure, the cross-sectional shape of the above-described dam structure that is perpendicular to the plane where the base substrate 100 is located is identical at any position, which can reduce a difficulty in a fabrication process. In other embodiments, a dam structure may be constituted by segments, for example, constituted by discrete multi-segment side walls, and each segment of side wall has a different cross-sectional shape in a plane perpendicular to the plane where the base substrate 100 is located.

There are various methods for forming the light-shielding portion 102, for example, integral molding or split molding. Integral molding refers to that the light-shielding portion has an integral structure and can be formed in a same process step; and split molding refers to that the light-shielding portion is composed of several portions which are formed in different process steps.

For example, firstly, a light-shielding thin film is formed, and then the light-shielding thin film is patterned to form the light-shielding portion including the groove. For another example, the light-shielding portion includes a spacer layer and a light-shielding layer located on the spacer layer; the spacer layer and the light-shielding layer are made of a same material and formed in a same process step; and the integral molding method facilitates reducing costs of the fabrication process.

Figure 5:
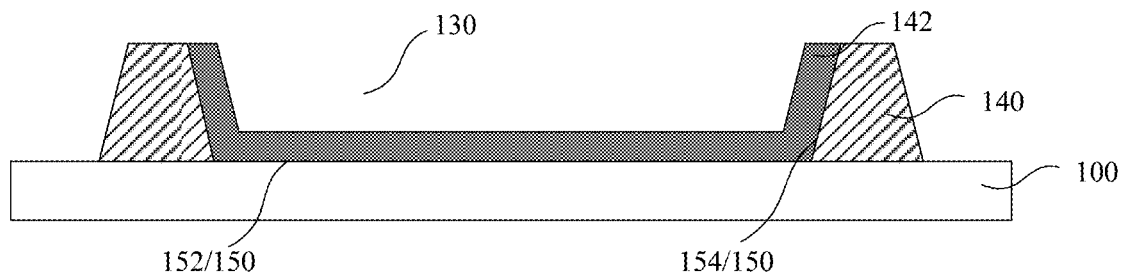
FIG. 5 is a cross-sectional view of a light-shielding portion according to still another embodiment of the present disclosure.
Figure 6:
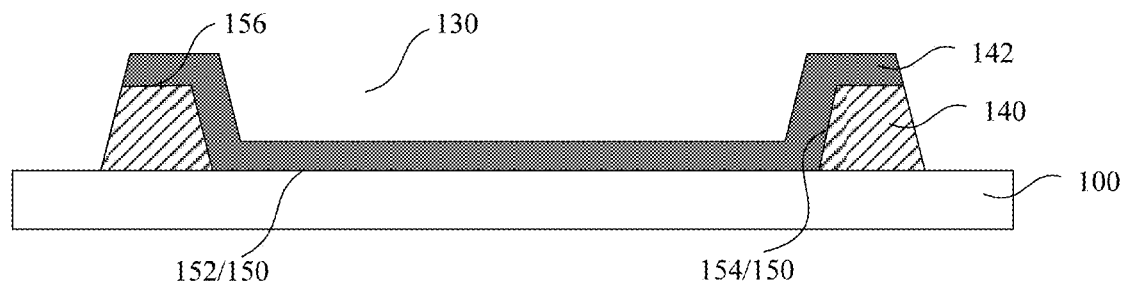
FIG. 6 is a cross-sectional view of a light-shielding portion according to another embodiment of the present disclosure.
Figure 7:
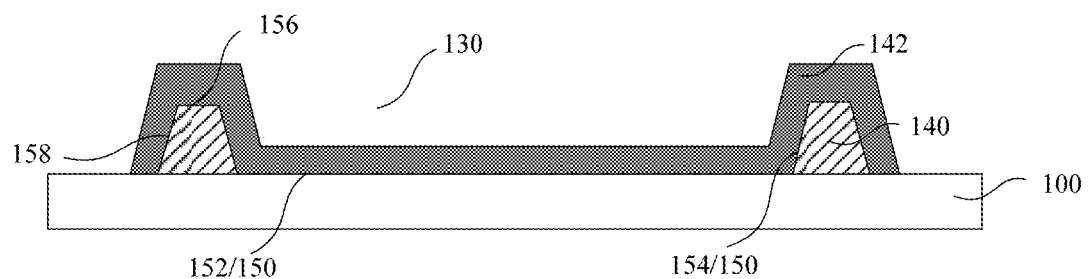
FIG. 7 is a cross-sectional view of a light-shielding portion according to still another embodiment of the present disclosure.

FIG. 5 to FIG. 7 illustrate a plurality of examples of a light-shielding portion including a spacer layer and a light-shielding layer according to the embodiment of the present disclosure.

For example, as illustrated in FIG. 5, a light-shielding portion 102 includes a spacer layer 140 and a light-shielding layer 142 located on the spacer layer; and a groove 130 is formed in the light-shielding layer 142. The spacer layer 140 defines an opening 150, for example, the opening 150 is formed in the spacer layer 140; the light-shielding layer 142 overlays a bottom portion 152 and a side wall 154 of the opening. It should be noted that, the opening 150 may be a blind hole or a via hole; the blind hole refers to a hole that does not penetrate the spacer layer 140, and the via hole refers to a hole that penetrates the spacer layer 140. For example, the opening 150 is a via hole formed in the spacer layer 140 and penetrating the spacer layer 140 (as illustrated in FIG. 5), or, the opening is a blind hole formed in the spacer layer 140. In the embodiment of the present disclosure, it is described with a case where the opening is a via hole as an example. For example, the light-shielding layer 142 is provided on the bottom portion 152 and the side wall 154 of the opening 150 in conformity with the opening 150, to form the groove 130; or, the opening 150 is filled with the light-shielding layer 142, and then the groove 130 is formed in the light-shielding layer 142, herein, the groove is formed in a mode including, but not limited to, etching, nanoimprinting, drilling, and so on. Since the opening 150 penetrates the spacer layer 140, the base substrate 100 is exposed at the bottom portion 152 of the opening 150, and the light-shielding layer 142 overlays the exposed base substrate 100 located at the bottom portion 152.

For example, as illustrated in FIG. 6, a light-shielding layer 142 overlays a bottom portion 152 and a side wall 154 of an opening 150, as well as a top surface 156 of the spacer layer 140. As compared with the light-shielding layer illustrated in FIG. 5, the light-shielding layer 142 of FIG. 6 further extends to an outer surface of the periphery of the opening 150, so that the light-shielding layer 142 can not only shield light incident onto the side surface of the active layer, but also shield light from a rear side of the base substrate and incident onto a lower surface of the active layer. It can be understood that, although the light-shielding layer 142 of FIG. 6 overlays the entire top surface 156 of the spacer layer 140, in other embodiments, a light-shielding layer 142 may overlay a portion of a top surface 156 of a spacer layer 140, which can also achieve the above-described objective.

For example, as illustrated in FIG. 7, a light-shielding layer 142 overlays a bottom portion 152 and a side wall 154 of an opening 150, as well as a top surface 156 of a spacer layer 140 and an outer surface 158 of the spacer layer 140. As compared with FIG. 6, the light-shielding layer 142 of FIG. 7 further extends to the outer surface 158 of the spacer layer 140 such that the light-shielding layer 142 completely encloses the spacer layer 140. Because the light-shielding layer 142 is provided on both an inner surface (i.e., the side wall 154) and the outer surface 158 of the spacer layer 140, it has a double-shielding effect on light incident onto a side surface of an active layer, and further enhances a light shielding effect on a light-shielding portion.

For example, the spacer layer 140 may be formed of any material, including an insulating material. In one example, the spacer layer 140 is formed of an organic material such as acrylate or a polyimide resin, which has a characteristic of high-temperature resistance. A thickness of the spacer layer 140 may be set according to actual needs, for example, the thickness is in a range of 1 µm to 5 µm. In one example, the thickness of the spacer layer 140 is greater than a thickness of the light-shielding layer 142, for example, the thickness of the spacer layer 140 is in a range of 1.5 µm to 3 µm.

Figure 8:
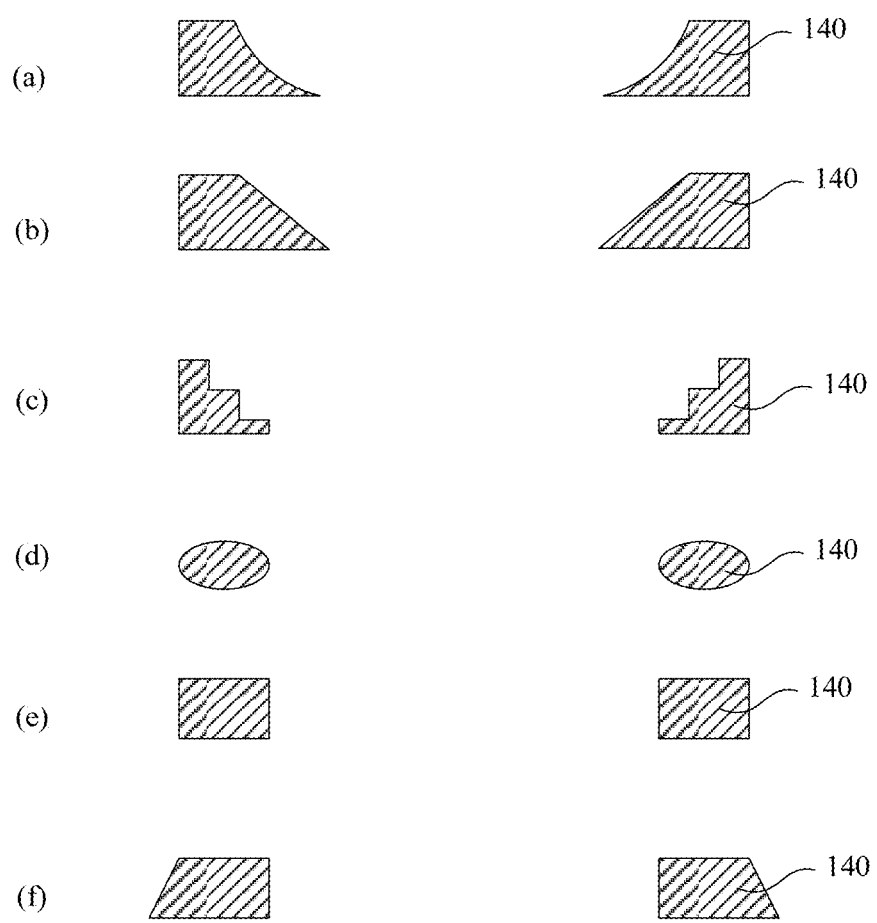
FIG. 8(a) to FIG. 8(f) illustrate a plurality of examples of a spacer layer according to embodiments of the present disclosure.

It can be understood that, the cross-sectional shape of the spacer layer 140 in the plane perpendicular to the plane where the base substrate is located is not limited to the trapezoid illustrated in FIG. 5 to FIG. 7. In other embodiments, a spacer layer 140 may have a regular shape such as a rectangle, a circle and an ellipse, or may also have an irregular shape such as a step shape. FIG. 8(*a*) to FIG. 8(*f*) show a plurality of examples of the spacer layer according to the embodiment of the present disclosure. For the cross-sectional shapes of the spacer layer of FIG. 8(*a*) to FIG. 8(*f*), the description of the cross-sectional shapes of the dam structure in the plane perpendicular to the plane where the base substrate is located according to the foregoing embodiments may be referred to, and no details will be repeated here.

For example, the light-shielding layer 142 may be formed of any material having a light-blocking property. For example, the light-shielding layer 142 may be formed of an insulating material having a light-blocking property, for example, a black resin. In one example, the light-shielding layer 142 is formed of acrylate to which an organic black pigment is added, or polyimide to which an organic black pigment is added, or a mixture of the two as described above. The light-shielding layer may also be formed of a conductive material (for example, a metal or an alloy) or a semiconductor material having a light-blocking property. It should be noted that, in the case that the light-shielding portion is made of a conductive material or a semiconductor material, in order to be insulated from the gate electrode 104, for example, an insulating layer is provided between the light-shielding portion 102 and the gate electrode 104. It can be understood that, the spacer layer 140 and the light-shielding layer 142 in FIG. 5 to FIG. 7 may be formed of a same material, that is, the two may be integrally formed, which facilitates reducing a fabrication process and costs. For example, the spacer layer 140 and the light-shielding layer 142 are both formed of a material having a light-blocking property.

For example, in order to effectively prevent light from being incident onto the side surface of the active layer 108, a distance d1 between a topmost surface of the light-shielding portion 102 that is away from the base substrate 100 and the base substrate 100 is greater than or equal to a distance d2 between a topmost surface of the active layer 108 that is away from the base substrate 100 and the base substrate 100, as illustrated in FIG. 2. For example, while d1 is equal to d2, the light-shielding portion 102 can shield light that is parallel to the base substrate from irradiating onto the side surface of the active layer 108; while d1 is greater than d2, the light-shielding portion 102 can not only shield light that is parallel to the base substrate from irradiating onto the side surface of the active layer 108, but also can shield light incident in an oblique direction with respect to the base substrate from irradiating onto the side surface of the active layer 108, so as to further enhance the light shielding effect on the active layer 108. For another example, a depth of the groove 130 is greater than or equal to the distance between the topmost surface of the active layer 108 that is away from the base substrate 100 and the base substrate. For another example, the depth of the groove 130 is greater than or equal to a total thickness of the gate electrode 104, the gate insulating layer 106 and the active layer 108.

For example, as illustrated in FIG. 2, the gate electrode 104, the gate insulating layer 106 and the active layer 108 are all located in the groove 130, herein, the gate insulating layer 106 is located between the gate electrode 104 and the active layer 108, and overlays the entire light-shielding portion 102. That is, the gate insulating layer 106 overlays the entire upper surface of the light-shielding portion 102. It can be understood that, the arrangement of the gate insulating layer 106 is not limited thereto, and in other embodiments, a gate insulating layer 106 at least overlays an entire upper surface of a gate electrode 104. For example, the gate insulating layer 106 overlays only the entire upper surface of the gate electrode 104; or, the gate insulating layer 106 overlays the entire upper surface of the gate electrode 104 and a bottom portion 132 of a groove 130; or, the gate insulating layer 106 overlays the entire upper surface of the gate electrode 104, the bottom portion 132 of the groove 130, as well as four side walls 134*a*, 134*b*, 134*c*, 134*d*.

Figure 9:
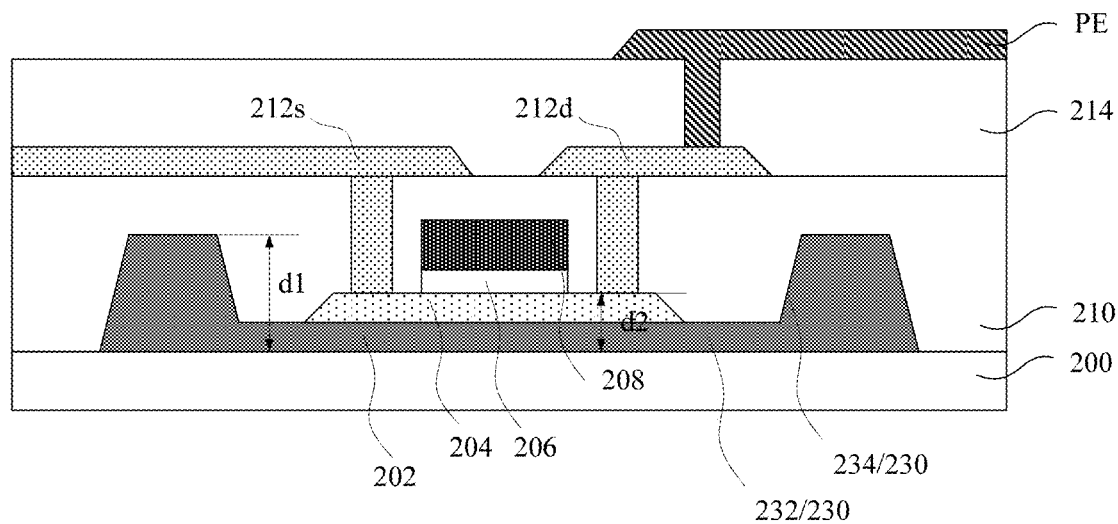
FIG. 9 is a cross-sectional view of a thin film transistor according to another embodiment of the present disclosure.

FIG. 1 to FIG. 2 illustrate a structure in which the light-shielding portion is applied to a thin film transistor of a bottom gate type; however, the light-shielding portion according to the embodiment of the present disclosure is not only applicable to the thin film transistor of the bottom gate type, but also applicable to a thin film transistor of a top gate type. FIG. 9 is a structural schematic diagram of another thin film transistor according to an embodiment of the present disclosure.

As illustrated in FIG. 9, the thin film transistor comprises: a base substrate 200; a gate electrode 208, an active layer 204, a source electrode 212*s* and a drain electrode 212*d* located on the base substrate 200. The thin film transistor further comprises a light-shielding portion 202 located between the active layer 204 and the base substrate 200; the light-shielding portion 202 includes a groove 230; and the active layer 204 is located in the groove 230.

In the above-described thin film transistor, by arranging the active layer 204 in the groove 230 of the light-shielding portion 202, light incident onto a side surface of the active layer 208 can be reduced or even shielded, so as to reduce a leakage current caused by photo-generated carriers, and avoid an influence on performance of the thin film transistor.

It should be noted that, providing the light-shielding portion 202 to shield light from irradiating onto the side surface of the active layer 204 includes: providing the light-shielding portion 202 such that a portion of the side surface of the active layer 204 is not irradiated by light; or providing the light-shielding portion 202 such that the entire side surface of the active layer 204 is not irradiated by light.

For example, the thin film transistor further comprises film layers such as a gate insulating layer 206, a first dielectric layer 210, a second dielectric layer 214 and a pixel electrode PE. Their connection relationships with the gate electrode 208, the source electrode 212*s* and the drain electrode 212*d* of the thin film transistor are similar to that of the foregoing embodiment, and no details will be repeated here.

For example, the groove 230 includes a bottom portion 232 and a side wall 234, herein, the side wall 234 is located on the periphery of the active layer 204. For a specific configuration of the groove 230, the description of the groove 230 in the foregoing embodiment may be referred to, and no details will be repeated here. Similarly, for a specific configuration of the light-shielding portion 202, the description of the groove 201 in the foregoing embodiment may be referred to, and no details will be repeated here.

For example, in order to effectively prevent light from being incident onto the side surface of the active layer 204, as illustrated in FIG. 9, a distance d1 between a topmost surface of the light-shielding portion 202 that is away from the base substrate 200 and the base substrate 200 is greater than or equal to a distance d2 between a topmost surface (i.e., an upper surface) of the active layer 204 that is away from the base substrate 200 and the base substrate 200. For example, while d1 is equal to d2, the light-shielding portion 202 can shield light that is parallel to the base substrate from irradiating onto the side surface of the active layer 204; while d1 is greater than d2, the light-shielding portion 202 can not only shield light that is parallel to the base substrate from irradiating onto the side surface of the active layer 204, but also can shield light incident in an oblique direction with respect to the base substrate from irradiating onto the side surface of the active layer 204, so as to further enhance a light shielding effect on the active layer 204. For example, a depth of the groove 230 is greater than or equal to the distance between the upper surface of the active layer 204 that is away from the base substrate 200 and the base substrate 200. As compared with FIG. 2, since the active layer 204 is closer to the base substrate 200 than the gate electrode 208, the depth of the groove 130 only needs to be greater than or equal to a thickness of the active layer 204.

For example, in order to prevent water, oxygen or the like from diffusing into the active layer through a bottom film layer, ensure quality and interface characteristics of the film layer of the active layer, and ensure TFT characteristics, the thin film transistor further comprises a buffer layer located between the active layer 204 and the light-shielding portion 202. A material and a structure of the buffer layer will be described in an embodiment below.

An embodiment of the present disclosure further provides a fabrication method of a thin film transistor, the fabrication method comprising: providing a base substrate; forming a gate electrode, an active layer, a source electrode and a drain electrode on the base substrate; the fabrication method further comprising: forming a light-shielding portion between the active layer and the base substrate, herein, the light-shielding portion includes a groove, and the active layer is formed in the groove.

In the above-described fabrication method of the thin film transistor, by providing the active layer in the groove of the light-shielding portion, light incident onto the side surface of the active layer can be reduced or even shielded, so as to reduce a leakage current caused by photo-generated carriers, and avoid an influence on performance of the thin film transistor.

For example, the light-shielding portion may be formed by integral molding or split molding.

Figure 10:
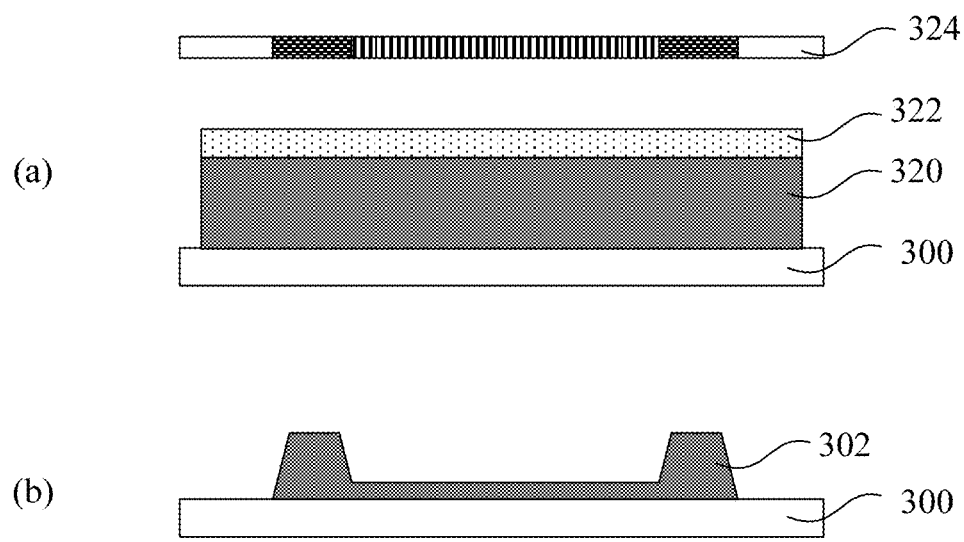
FIG. 10(a) to FIG. 10(b) are schematic diagrams of respective steps in a fabrication method of a light-shielding portion according to an embodiment of the present disclosure.

For example, the light-shielding portion is formed by integral molding, as illustrated in FIG. 10(a) and FIG. 10(b), and the forming a light-shielding portion 302 includes: forming a light-shielding thin film 320 on a base substrate 300; and patterning the light-shielding thin film 320 to form a light-shielding portion 302 including a groove.

For example, the patterning process includes a photolithographic patterning process or the like. The photolithographic patterning process may include, for example, coating a photoresist layer 322 on the light-shielding thin film 320 to be patterned; exposing the photoresist layer 322 with a dual-tone mask or a gray-tone mask 324 to expose the photoresist layer; developing the photoresist layer to obtain a photoresist pattern; etching the light-shielding thin film 320 by using the photoresist pattern as a mask; then ashing the photoresist pattern; performing secondary etching on the remaining light-shielding thin film by using the ashed photoresist pattern as a mask; and then removing the remaining photoresist layer to finally obtain the light-shielding portion 302. For a specific material of the light-shielding portion 302, the specific description of the light-shielding portion in the foregoing embodiment may be referred to, and no details will be repeated here. It can be understood that, in addition to the photolithographic patterning process, patterning methods suitable for use on the light-shielding thin film in the art are all included in the embodiment of the present disclosure, for example, ink jet printing, or the like.

Figure 11:
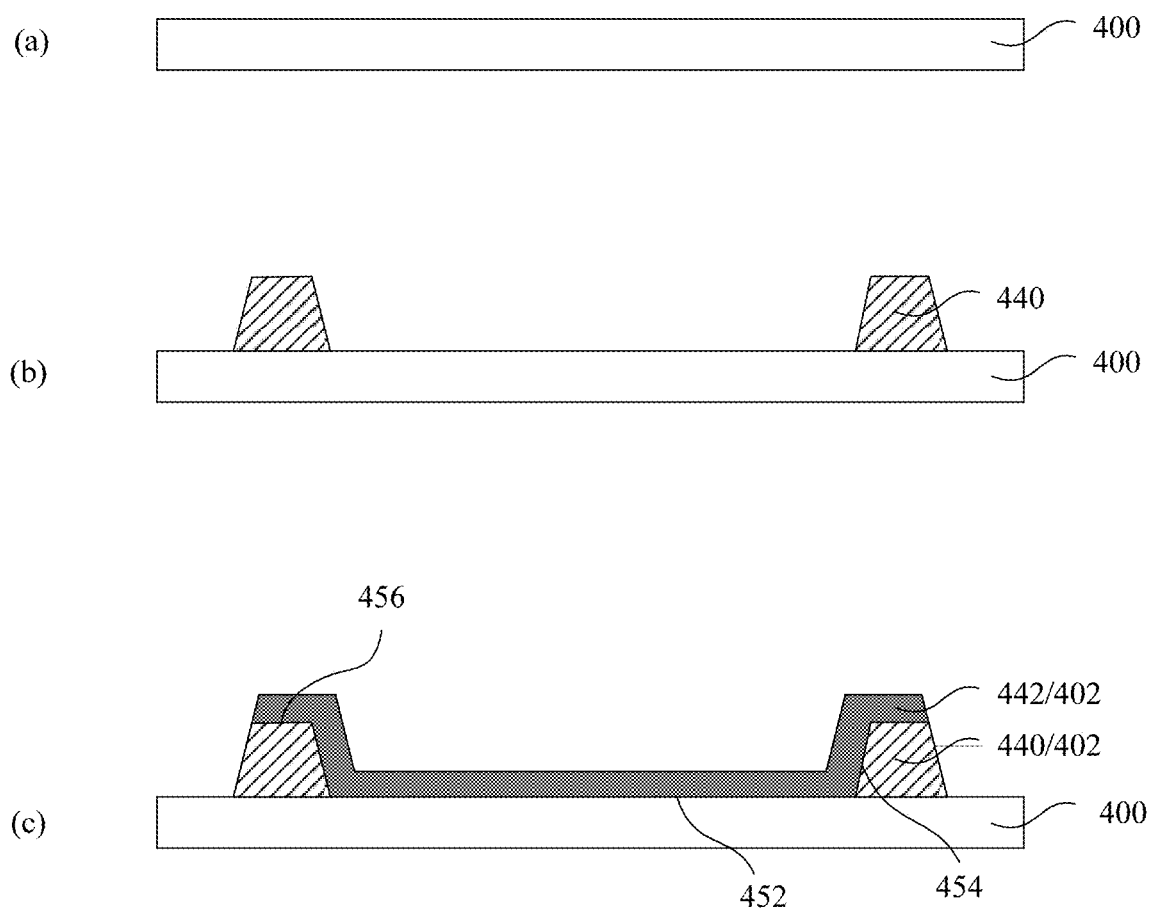
FIG. 11(a) to FIG. 11(c) are schematic diagrams of respective steps in a fabrication method of a light-shielding portion according to another embodiment of the present disclosure.

For another example, the light-shielding portion is formed by split molding, as illustrated in FIG. 11(a) to FIG. 11(c), and the forming a light-shielding portion 402 includes: forming a spacer layer 440 defining an opening on a base substrate 400; and forming a light-shielding layer 442 on the spacer layer 440, the groove being formed in the light-shielding layer 442; herein, the light-shielding layer 442 overlays a bottom portion 452 and a side wall 454 of the opening, as well as a top surface 456 of the spacer layer 440; and the side wall 454 is located on the periphery of an active layer. For specific materials and arrangement modes of the light-shielding layer 442 and the spacer layer 440, the description in the foregoing embodiment may be referred to, and no details will be repeated here.

For ease of understanding, the fabrication method of the thin film transistor will be described in detail below with a thin film transistor of a top gate type as an example.

Figure 30:
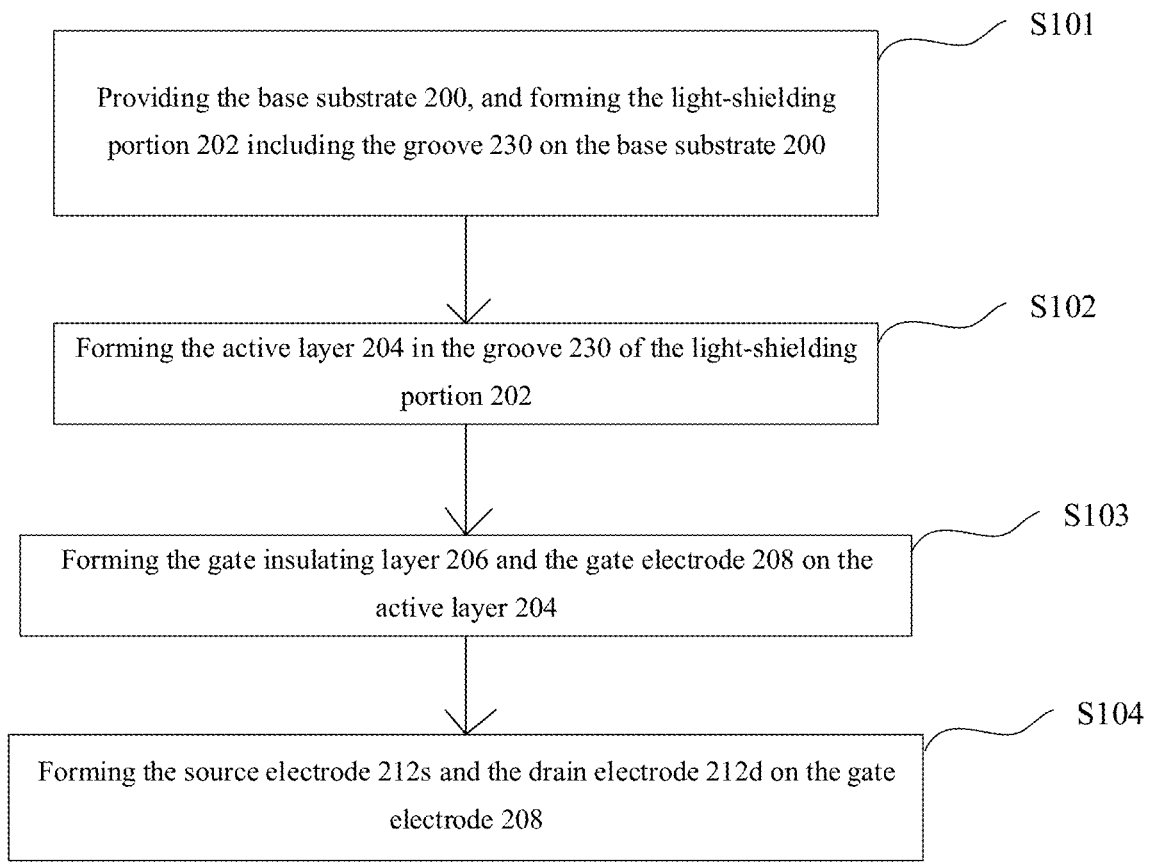
FIG. 30 is a flow chart of a fabrication method of a thin film transistor according to an embodiment of the present disclosure.

For example, as illustrated in FIG. 30, the fabrication method of the thin film transistor of FIG. 9 comprises:

S101: providing the base substrate 200, and forming the light-shielding portion 202 including the groove 230 on the base substrate 200.

For example, the base substrate 200 is made of a material such as amorphous silicon, or quartz, and so on. For a material, a structure and a preparation process of the light-shielding portion 202, the foregoing description of the light-shielding portion may be referred to, and no details will be repeated here.

S102: forming the active layer 204 in the groove 230 of the light-shielding portion 202.

For example, a material of the active layer may include amorphous silicon and polycrystalline silicon, as well as metal oxides such as indium gallium zinc oxide (IGZO), indium zinc oxide (IZO), zinc oxide (ZnO), gallium zinc oxide (GZO), or the like.

S103: forming the gate insulating layer 206 and the gate electrode 208 on the active layer 204.

For example, a material of the gate insulating layer may include silicon nitride (SiNx), silicon oxide (SiOx), aluminum oxide (Al2O3), aluminum nitride (AlN), or other suitable materials. For example, the gate insulating layer may have a single layer or a plurality of layers.

For example, a material of the gate electrode may be a copper-based metal, for example, copper (Cu), a copper-molybdenum alloy (Cu/Mo), a copper-titanium alloy (Cu/Ti), a copper-molybdenum-titanium alloy (Cu/Mo/Ti), a copper molybdenum-tungsten alloy (Cu/Mo/W), a copper-molybdenum-niobium alloy (Cu/Mo/Nb), or the like. The gate electrode material may also be a chromium-based metal, for example, a chromium-molybdenum alloy (Cr/Mo), a chromium-titanium alloy (Cr/Ti), a chromium-molybdenum-titanium alloy (Cr/Mo/Ti), or the like. The material of the gate electrode may also be aluminum or an aluminum alloy, or the like.

S104: forming the source electrode 212s and the drain electrode 212d on the gate electrode 208. For example, the first dielectric layer 210 is formed firstly, the first dielectric layer 210 has two contact holes, and then the source electrode 212s and the drain electrode 212d are formed, herein, the source electrode 212s is connected with the active layer 204 through one of the two contact holes, and the drain electrode 212d is connected with the active layer 204 through the other contact hole.

For example, a material of the first dielectric layer may include silicon nitride (SiNx), silicon oxide (SiOx), as well as acrylic resins, or the like. For example, a material of the source electrode and the drain electrode may include a metal and an alloy material, and may be formed into a single-layer or multi-layer structure, for example, formed into aluminum single-layer structure, molybdenum single-layer structure, or a structure with an aluminum layer sandwiched between two molybdenum layers. The second dielectric layer according to the embodiment of the present disclosure may be made of the same material as the first dielectric layer, and in other embodiments, materials of the two dielectric layers may be different from each other.

For example, in order to prevent water, oxygen or the like from diffusing into the active layer through a bottom film layer, and ensure quality and interface characteristics of the film layer of the active layer, between step S101 and step S102, the fabrication method further comprises: forming a buffer layer between the light-shielding portion 202 and the active layer 204.

It should be noted that, the above-described embodiment is described with fabrication of the thin film transistor of the top gate type as an example; in a fabrication method of a thin film transistor of a bottom gate type, a formation order of the above-described respective steps will be adjusted, for example, the gate electrode is formed before the active layer, etc., and these changes and adjustments are all included in the embodiment of the present disclosure.

An embodiment of the present disclosure further provides an array substrate, comprising the thin film transistor according to any one of the foregoing embodiments. In the array substrate, the active layer of the thin film transistor is provided in the groove of the light-shielding portion, so the array substrate has same technical effects as the thin film transistor described in the foregoing embodiment, and no details will be repeated here.

For example, the array substrate further comprises a plurality of gate lines and a plurality of data lines located on the base substrate; and these gate lines and data lines intersect with each other to define sub-pixel units (or sub-areas) arranged in a matrix.

For example, when applied to a Thin Film Transistor Liquid Crystal Display (TFT-LCD), each sub-pixel unit of the array substrate includes the thin film transistor according to any one of the foregoing embodiments as a switching element, and further includes a pixel electrode and a common electrode for controlling alignment of liquid crystals. For example, a gate electrode of a thin film transistor of each pixel is connected or integrally formed with a corresponding gate line; a source electrode is connected or integrally formed with a corresponding data line; and a drain electrode is connected or integrally formed with a corresponding pixel electrode.

For example, when applied to an Organic Light-Emitting Diode (OLED) display device, the above-described array substrate is OLED array substrate comprising the thin film transistor according to any one of the foregoing embodiments.

For example, the OLED array substrate further comprises: a plurality of gate lines and a plurality of data lines located on the base substrate, herein, the plurality of gate lines and the plurality of data lines intersect with each other to define a plurality of sub-areas, the plurality of sub-areas include at least one pixel area provided with the thin film transistor, herein, the thin film transistor comprises a first thin film transistor and a second thin film transistor, the first thin film transistor includes a first active layer and a common light-shielding portion located between the first active layer and the base substrate, the common light-shielding portion includes a common groove. The second thin film transistor includes a second active layer. The common light-shielding portion extends between the second active layer and the base substrate, such that the first active layer and the second active layer are both located in the common groove.

In the above-described OLED array substrate, by providing the first active layer and the second active layer in the common groove of the common light-shielding portion, light incident onto side surfaces of the two active layers can be reduced or even shielded, so as to reduce a leakage current caused by photo-generated carriers, and avoid an influence on performance of the first thin film transistor and the second thin film transistor.

Figure 12:
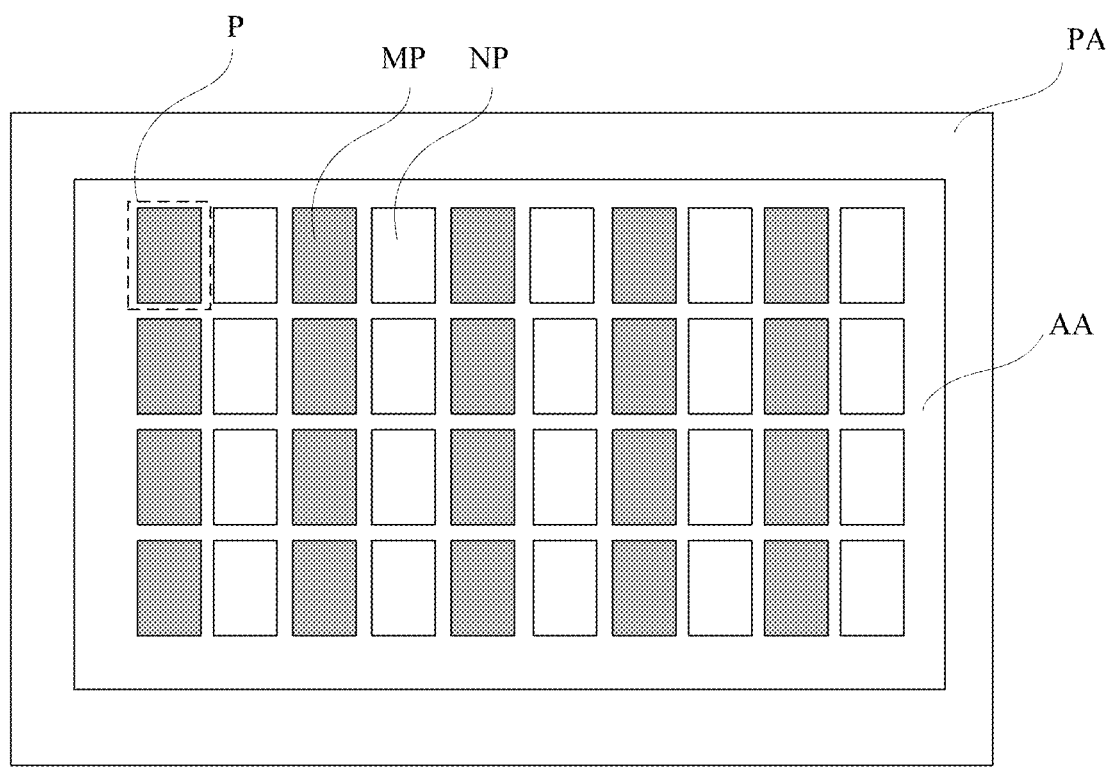
FIG. 12 is a structural schematic diagram of an OLED array substrate according to an embodiment of the present disclosure.

FIG. 12 is a structural schematic diagram of the OLED array substrate according to the embodiment of the present disclosure. As illustrated in FIG. 12, the OLED array substrate comprises an active area (AA) and a peripheral area (PA) outside the active area; the active area AA is usually used to display, and the peripheral area may be used to arrange a driving circuit and encapsulate a display panel, etc. A plurality of gate lines and a plurality of data lines (not shown) are provided in the active area AA. The plurality of gate lines and the plurality of data lines intersect with each other to define a plurality of sub-areas P. The plurality of sub-areas P include at least one pixel area MP provided with the thin film transistor and at least one non-pixel area NP. The pixel area MP refers to an area including an electronic element such as a thin film transistor or a light emitting unit. The non-pixel area NP refers to an area that does not contain any light emitting element or electronic element, for example, a transparent opening area in a display device. As illustrated in FIG. 12, in each row, pixel areas MP and non-pixel areas NP are alternately arranged; and in a same column, areas are the same, all being pixel areas or all being non-pixel areas. In at least one embodiment, such an arrangement can facilitate arrangement of wirings. It can be understood that, sizes, quantities and arrangements of the pixel areas MP or the non-pixel areas NP are not limited to a case as described in FIG. 12, and these parameters depend on a demand for display effects in actual application. For example, a total area of the non-pixel areas NP may be set to be 20% to 80% of an entire active area, and the remaining areas are all set to pixel areas MP.

Figure 17:
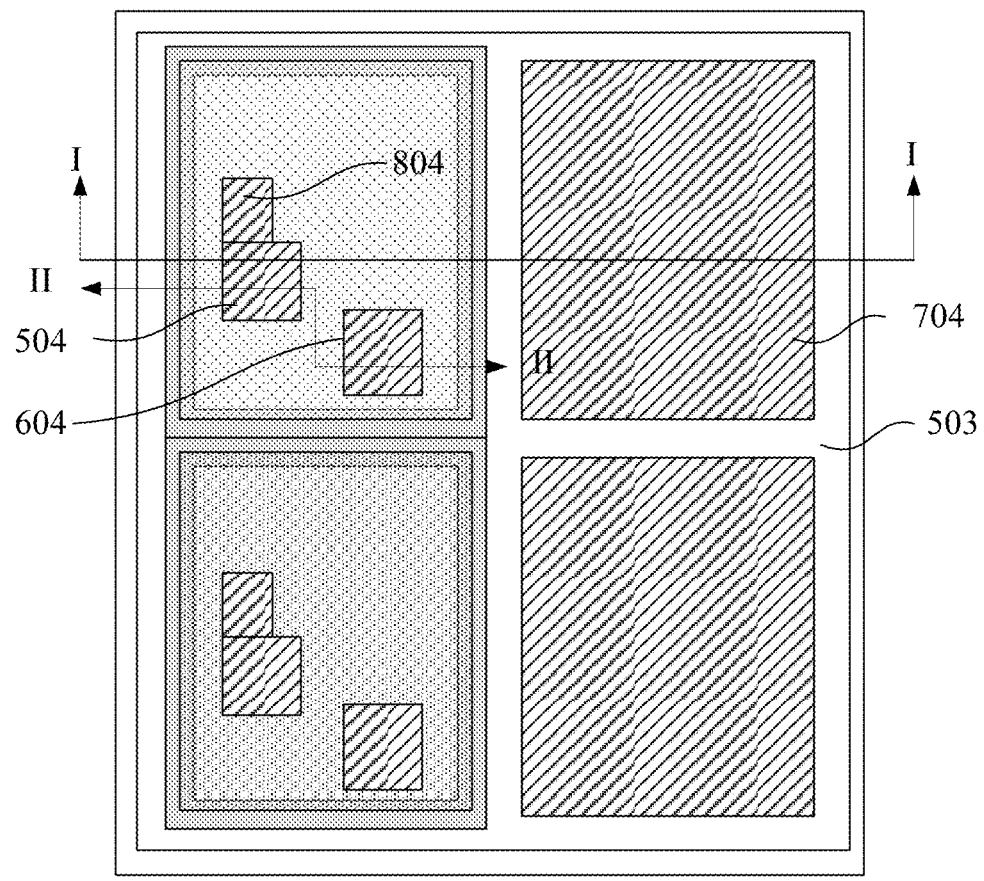
FIG. 17 is a schematic diagram of forming a buffer layer and an active layer in a fabrication method of the OLED array substrate according to an embodiment of the present disclosure.
Figure 18:
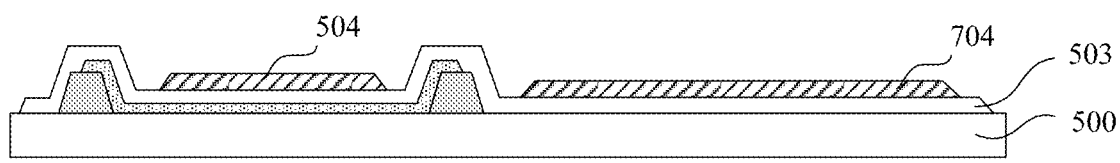
FIG. 18 is a cross-sectional view taken along line I-I of FIG. 17.
Figure 19:
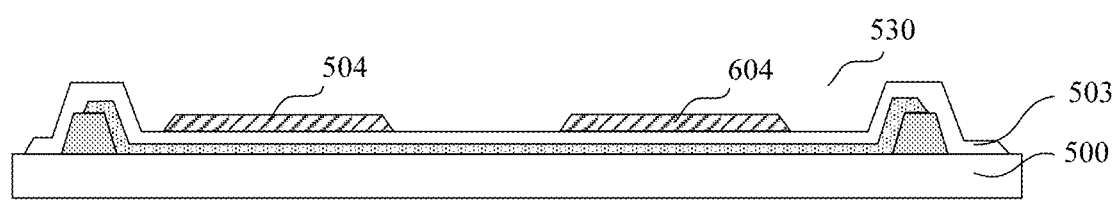
FIG. 19 is a cross-sectional view taken along line II-II of FIG. 17.
Figure 22:
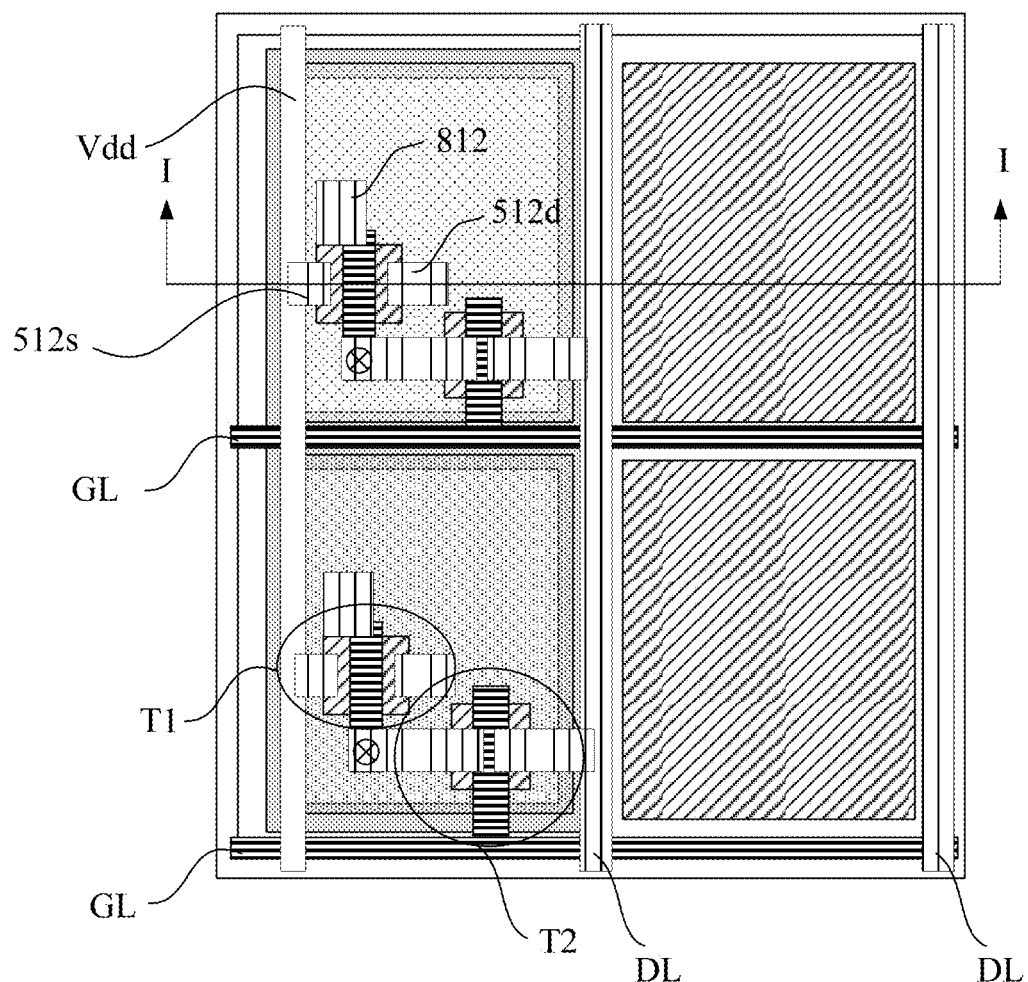
FIG. 22 is a schematic diagram of forming a source electrode and a drain electrode in a fabrication method of the OLED array substrate according to an embodiment of the present disclosure.
Figure 28:
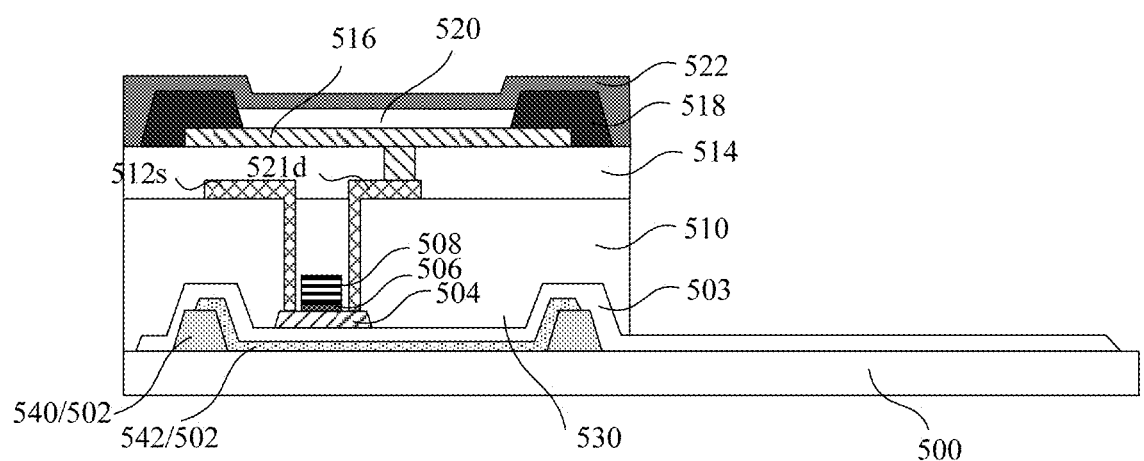
FIG. 28 is a partial cross-sectional view of an OLED array substrate according to an embodiment of the present disclosure.

FIG. 17 is a plan view of a buffer layer and an active layer in a fabrication method of an OLED array substrate according to an embodiment of the present disclosure; and FIG. 18 and FIG. 19 are cross-sectional views respectively taken along lines I-I and II-II of FIG. 17. FIG. 22 is a plan view of the OLED array substrate after a drive transistor and a switch transistor are formed in the fabrication method of the OLED array substrate according to the embodiment of the present disclosure. FIG. 28 is a partial cross-sectional view of the OLED array substrate according to the embodiment of the present disclosure. As illustrated in FIG. 17, FIG. 19 and FIG. 22, the OLED array substrate comprises a drive transistor T1 and a switch transistor T2. The drive transistor T1 includes an active layer 504 and a common light-shielding portion 502 located between the active layer 504 and a base substrate 500; and the common light-shielding portion 502 includes a common groove 530. The switch transistor T2 includes an active layer 604; and the common light-shielding portion 502 extends between the active layer 604 and the base substrate 500, such that both active layers 504 and 604 are located in the common groove 530 of the common light-shielding portion 502. For example, a side wall of the common groove 530 is located on the periphery of both the active layer 504 and the active layer 604.

In the above-described OLED array substrate, by providing the active layers 504 and 604 in the common groove 530 of the common light-shielding portion 502, light incident onto side surfaces of the active layers 504 and 604 can be reduced or even shielded, so as to reduce a leakage current caused by photo-generated carriers, and avoid an influence on performance of the drive transistor T1 and the switch transistor T2.

For example, in FIG. 19, the active layers 504 and 604 are both located on a same buffer layer 503, and both have a same thickness, so their distances to the base substrate 500 are equal to each other. At this time, a distance from a topmost surface of the common light-shielding portion 502 to the base substrate 500 is greater than or equal to a distance from an upper surface of any one of the active layer 504 and the active layer 604 to the base substrate 500. The transistors T1 and T2 of FIG. 19 are both thin film transistors of bottom gate type. However, the two transistors T1 and T2 may be also thin film transistors of top gate type; or, one is a thin film transistor of top gate type, and the other is a thin film transistor of bottom gate type. Therefore, a positional relationship of the two active layers 504 and 604 is not limited to a case illustrated in FIG. 19. Moreover, thicknesses of the two active layers may be different from each other, and the two active layers may also be provided on different layers, which are all included in the embodiment of the present disclosure.

For example, when the two active layers are provided in different layers, or when the thicknesses of the two active layers are different from each other, distances from topmost surfaces of the two active layers to the base substrate 500 are different from each other, in this case, the distance from the topmost surface of the common light-shielding portion 502 to the base substrate 500 is greater than or equal to the distance from the topmost surface of one of the two active layers that is farther away from the base substrate 500 to the base substrate. It is assumed that, the distance from the topmost surface of the active layer of T1 to the base substrate 500 is d11, the distance from the topmost surface of the active layer of T2 to the base substrate 500 is d12. In the case that d11 is greater than d12, then, the distance from the common light-shielding portion 502 to the base substrate 500 is greater than or equal to d11. In this way, it can be ensured that the active layers of the two transistors T1 and T2 simultaneously avoid an influence by light irradiation.

Figure 29:
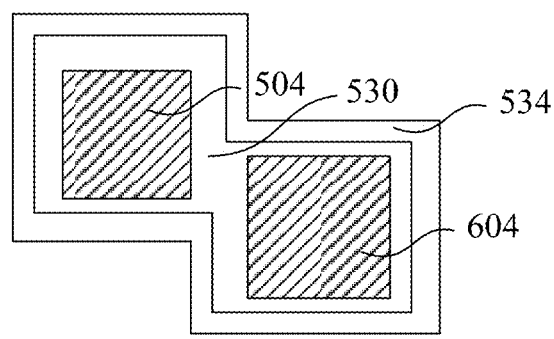
FIG. 29 is a structural schematic diagram of two active layers and a common light-shielding portion of the OLED array substrate according to an embodiment of the present disclosure.

For example, the light-shielding layer includes two grooves, and the active layers 504 and 604 are respectively provided in the two grooves, which can also achieve the objective of the present disclosure. In addition, there may also be a plurality of modes that the common light-shielding portion 502 in FIG. 17 surrounds the periphery of the two active layers 504 and 604. For example, as illustrated in FIG. 29, the side wall 534 of the common groove 530 extends along an outer contour of both the active layers 504 and 604, and is connected head to tail to form a dam structure, and such a mode can also achieve the objective of the present disclosure. The dam structure may also have a regular shape such as a rectangular loop, a circular loop and an elliptical loop, or any other irregular shape; and for a specific configuration, the description in the foregoing embodiment may be referred to.

As illustrated in FIG. 28, the at least one pixel area MP is further provided with an organic light-emitting diode component. The organic light-emitting diode component includes a first electrode 516, a second electrode 522, and a pixel defining layer 518 located between the first electrode 516 and the second electrode 522; and the pixel defining layer 518 is configured to separate adjacent two organic light-emitting diode components. For example, the side wall of the common groove 530 is located in an area corresponding to the pixel defining layer 518, such that an orthographic projection of the common light-shielding portion 502 on the base substrate 500 at least partially overlaps an orthographic projection of the pixel defining layer 518 on the base substrate 500.

By providing the common light-shielding portion 502 in the area corresponding to the pixel defining layer 518, not only light incident onto the two transistors T1 and T2 can be reduced or even shielded, but also light incident onto an electronic component located inside the pixel defining layer, for example, light incident onto an organic light-emitting diode component or a storage capacitor, etc., can be reduced or even shielded; especially when it is applied to an OLED of a top-emitting type, an influence of ambient light on an OLED lighting effect can be further avoided. It can be understood that, the orthographic projection of the common light-shielding portion 502 on the base substrate 500 and the orthographic projection of the pixel defining layer 518 on the base substrate 500 may also not overlap each other, which can also achieve the objective of the present disclosure.

For example, the pixel defining layer 518 is usually formed of an organic insulating material (e.g., an acrylic resin) or an inorganic insulating material (e.g., silicon nitride (SiNx) or silicon oxide (SiOx)). The first electrode 516 and the second electrode 522 may be made of a same material; and a material suitable for fabricating the electrode includes, for example, a first metal conductive layer, a transparent conductive layer, or a stacked structure formed of the first metal conductive layer and the transparent conductive layer. In the embodiment of the present disclosure, the first electrode 516 and the second electrode 522 are both made of a transparent conductive material, which facilitates transparent display. For example, the transparent conductive material includes indium tin oxide (ITO), indium zinc oxide (IZO), indium gallium oxide (IGO), gallium zinc oxide (GZO), zinc oxide (ZnO), indium oxide (In2O3), aluminum zinc oxide (AZO) and a carbon nanotube, etc.

With further reference to FIG. 28, the common light-shielding portion 502 includes a common spacer layer 540 and a common light-shielding layer 542 located on the common spacer layer 540; the common groove 530 is formed in the common light-shielding layer 542; an orthographic projection of the common spacer layer 540 on the base substrate 500 is located in the orthographic projection of the pixel defining layer 518 on the base substrate. That is to say, an area of the orthographic projection of the common spacer layer 540 is less than or equal to an area of the orthographic projection of the pixel defining layer 518. Thus, the mask used in fabricating the common spacer layer 540 is same as that used in fabrication of the pixel defining layer 518, which reduces the number of masks used and avoids an influence on an aperture ratio.

Figure 27:
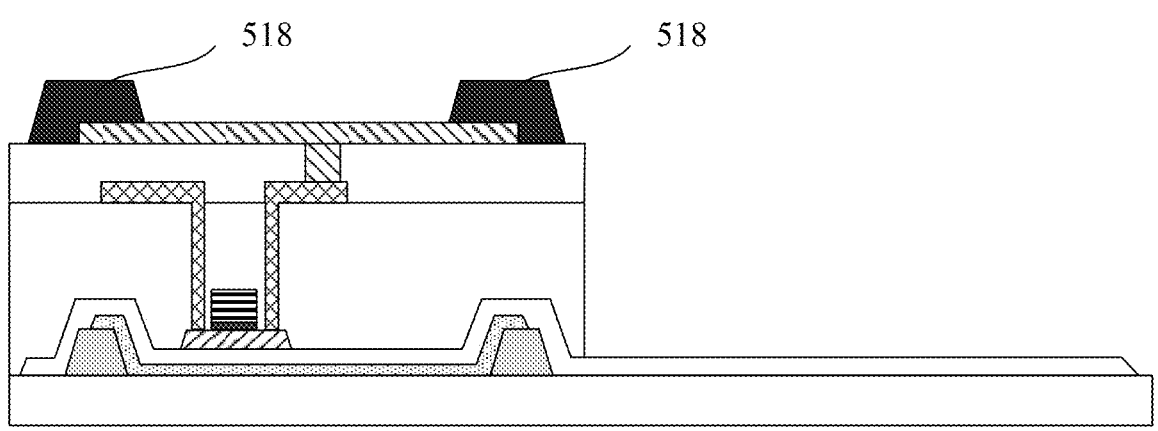
FIG. 27 is a cross-sectional view taken along line I-I of FIG. 26.

With further reference to FIG. 28, only the buffer layer 503 is provided in the non-pixel area NP. For example, the buffer layer 503 is formed of an inorganic material, which can increase surface flatness of the base substrate. After the pixel defining layer 518 illustrated in FIG. 27 is formed, an organic functional layer 520 and the second electrode 522 are formed only in the pixel area MP. For example, the organic functional layer 516 includes a light emitting layer, an electron injection layer, an electron transport layer, a hole injection layer and a hole transport layer. However, in the non-pixel area NP, no other layer or structure is formed on the buffer layer 503, and only the buffer layer 503 is reserved. As compared with an existing case where the non-pixel area is formed with a layer structure the same as that of the pixel area, the embodiment of the present disclosure can increase light transmittance of the non-pixel area.

An embodiment of the present disclosure further provides a fabrication method of an array substrate, herein, the array substrate comprises a thin film transistor, and the thin film transistor is fabricated by using the method according to any one of the foregoing embodiments.

In the above-described fabrication method of the array substrate, because the active layer of the thin film transistor is provided in the groove of the light-shielding portion, the array substrate has same technical effects as the thin film transistor described in the foregoing embodiment.

For example, the above-described array substrate is an OLED array substrate, and the fabrication method of the OLED array substrate comprises:

S201: forming a plurality of gate lines and a plurality of data lines on a base substrate, herein, the plurality of gate lines and the plurality of data lines intersect with each other to define a plurality of sub-areas, and the plurality of sub-areas include at least one pixel area and at least one non-pixel area.

For example, as illustrated in FIG. 12 and FIG. 22, a plurality of gate lines GL and a plurality of data lines DL intersect with each other to define a plurality of sub-areas P; and the plurality of sub-areas P include at least one pixel area MP and at least one non-pixel area NP.

S202: forming a first thin film transistor and a second thin film transistor in the at least one pixel area, herein, the first thin film transistor includes a first active layer and a common light-shielding portion located between the first active layer and the base substrate; the common light-shielding portion includes a common groove; the second thin film transistor includes a second active layer; the common light-shielding portion extends between the second active layer and the base substrate, such that the first active layer and the second active layer are both located in the common groove.

In the above-described fabrication method of the OLED array substrate, by providing the first active layer and the second active layer in the common groove of the common light-shielding portion, light incident onto side surfaces of the two active layers can be reduced or even shielded, so as to reduce a leakage current caused by photo-generated carriers, and avoid an influence on performance of the first thin film transistor and the second thin film transistor.

For example, as illustrated in FIG. 17 to FIG. 22, a drive transistor T1 and a switch transistor T2 are formed in at least one pixel area MP, and the drive transistor T1 and the switch transistor T2 respectively include active layers 504 and 604; and the active layers 504 and 604 are both located in a same groove, that is, located in a common groove 530 of the common light-shielding portion 502.

For example, as illustrated in FIG. 17 to FIG. 28, the above-described fabrication method further comprises: forming an organic light-emitting diode component in the at least one pixel area MP. For example, the organic light-emitting diode component includes a first electrode 516, a second electrode 522, and a pixel defining layer 518 located between the first electrode 516 and the second electrode 522; and the pixel defining layer 518 is configured to separate adjacent two organic light-emitting diode components. A side wall of the common groove 530 is located in an area corresponding to the pixel defining layer 518, such that an orthographic projection of the common light-shielding portion 502 on the base substrate 500 at least partially overlaps an orthographic projection of the pixel defining layer 518 on the base substrate 500. As described in the foregoing embodiment, by providing the common light-shielding portion 502 in the area corresponding to the pixel defining layer 518, not only light incident onto the two transistors T1 and T2 can be reduced or even shielded, but also light incident onto electronic components located inside the pixel defining layer can be reduced or even shielded, so that an influence of ambient light on an OLED lighting effect can be further avoided.

Figure 15:
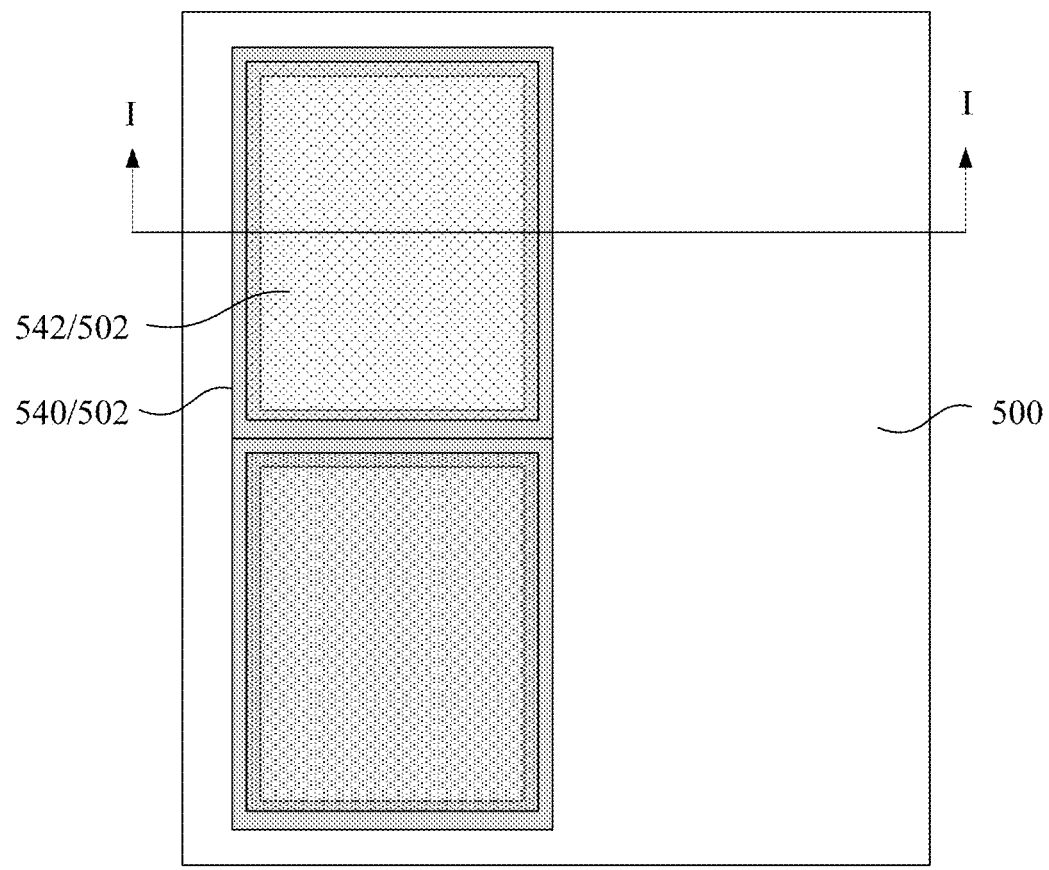
FIG. 15 is a schematic diagram of forming a light-shielding layer in the fabrication method of the OLED array substrate according to the embodiment of the present disclosure.
Figure 16:
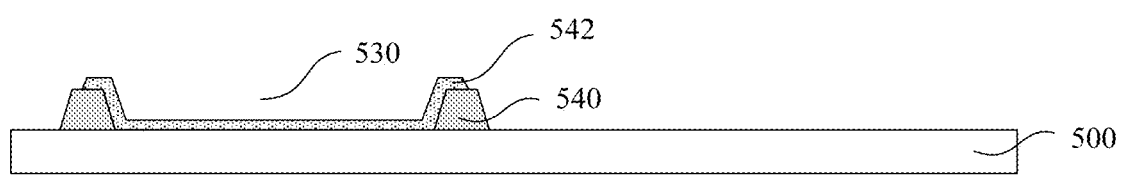
FIG. 16 is a cross-sectional view taken along line I-I of FIG. 15.

For example, as illustrated in FIG. 15 and FIG. 16, when the light-shielding portion is composed of two portions, i.e., a spacer layer and a light-shielding layer, the forming a common light-shielding portion 502 includes: forming a common spacer layer 540 on the base substrate 500, an orthographic projection of the common spacer layer 540 on the base substrate 500 being in an orthographic projection of the pixel defining layer 518 on the base substrate; forming a common light-shielding layer 542 on the common spacer layer 540; and forming a common groove 530 in the common light-shielding layer 542.

For example, as illustrated in FIG. 17 to FIG. 19, after the forming a common light-shielding portion 502, the above-described fabrication method further comprises: simultaneously forming a buffer layer 503 in the at least one pixel area MP and the at least one non-pixel area NP; herein, the thin film transistors T1 and T2 as well as the organic light-emitting diode component are formed on the buffer layer of the at least one pixel area MP, and only the buffer layer 503 is reserved in the non-pixel area MP. That is to say, before an encapsulation process is performed, the non-pixel area MP only has the buffer layer 503 therein, without any other layer or structure. When the encapsulation process of the display device is subsequently performed, the OLED array substrate is sealed with a cover plate by a encapsulation material; because only the buffer layer 503 is reserved in the non-pixel area MP, the encapsulation material may be in direct contact with the buffer layer 503, so as to increase light transmittance of the non-pixel area.

In the above-described fabrication method of the OLED array substrate, since the active layer 504 of the drive transistor T1 and the active layer 604 of the switch transistor T2 are provided in the common groove 530 of the common light-shielding portion 502, light incident onto side surfaces of the active layers 504 and 604 is reduced or even shielded, so as to reduce a leakage current caused by photo-generated carriers, and avoid an influence on performance of the thin film transistors T1 and T2.

Figure 31:
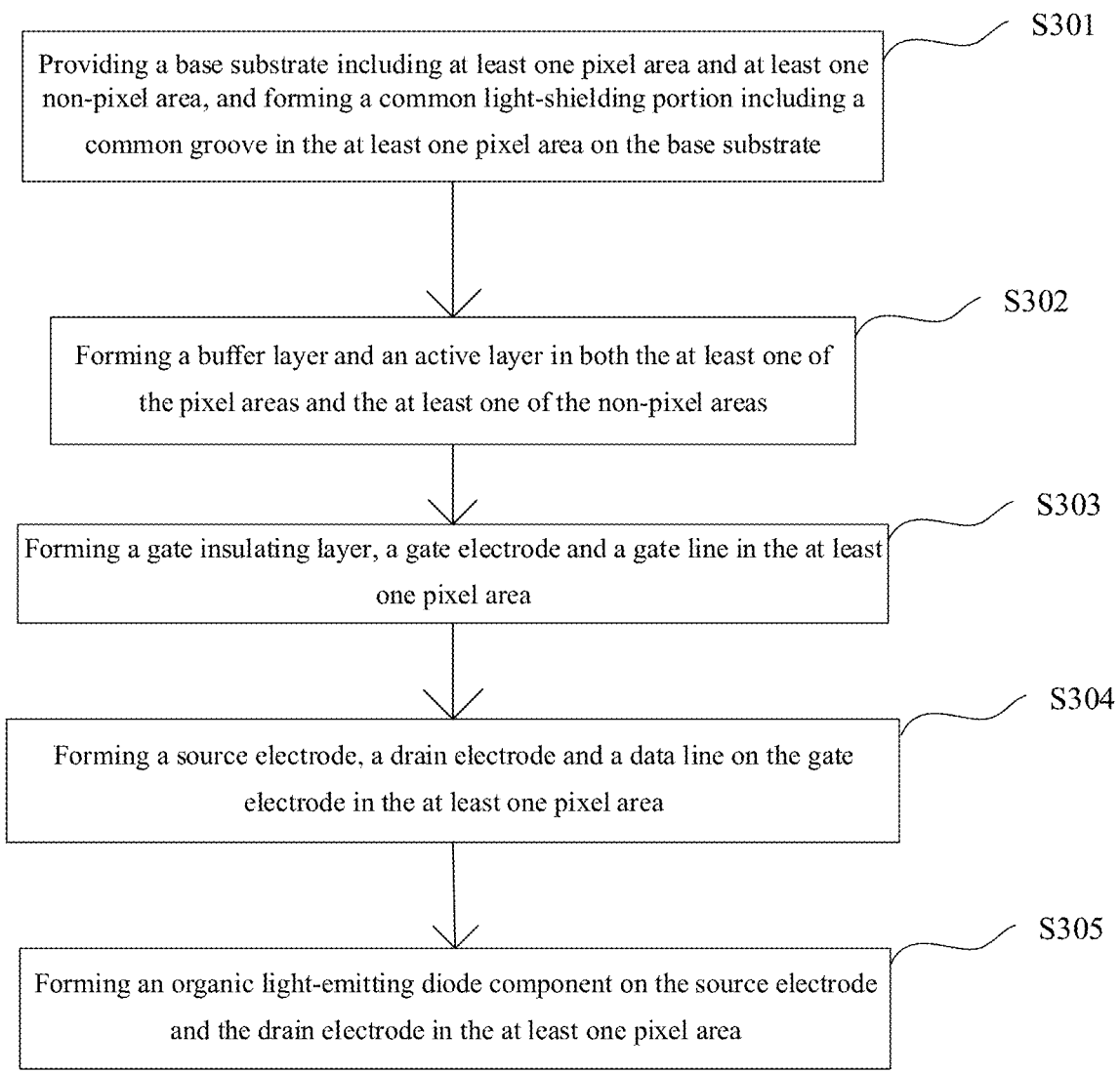
FIG. 31 is a flow chart of a fabrication method of an OLED array substrate according to an embodiment of the present disclosure.

For ease of understanding, a specific example of the fabrication method of the OLED array substrate is provided below. For example, as illustrated in FIG. 31, the fabrication method of the OLED array substrate comprises:

S301: providing a base substrate, the base substrate including at least one pixel area and at least one non-pixel area, and forming a common light-shielding portion including a common groove in at least one pixel area on the base substrate.

Figure 13:
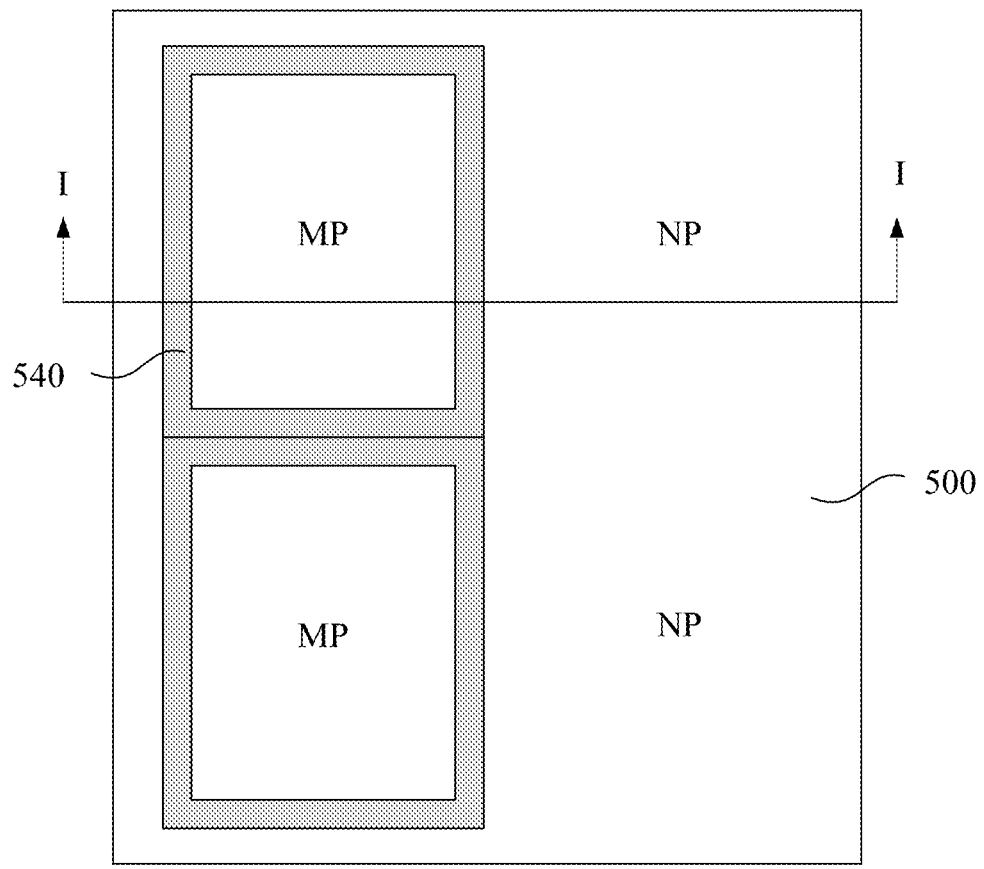
FIG. 13 is a schematic diagram of forming a spacer layer in a fabrication method of an OLED array substrate according to an embodiment of the present disclosure.
Figure 14:
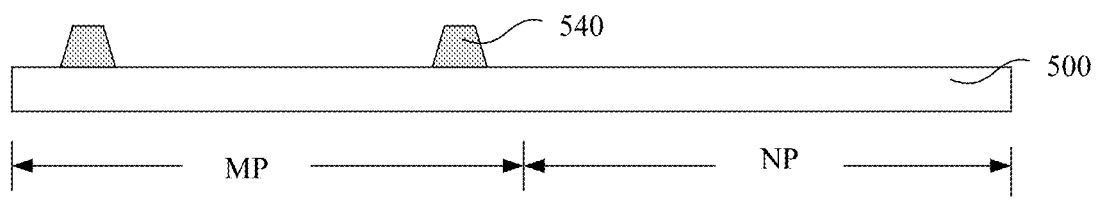
FIG. 14 is a cross-sectional view taken along line I-I of FIG. 13.
Figure 26:
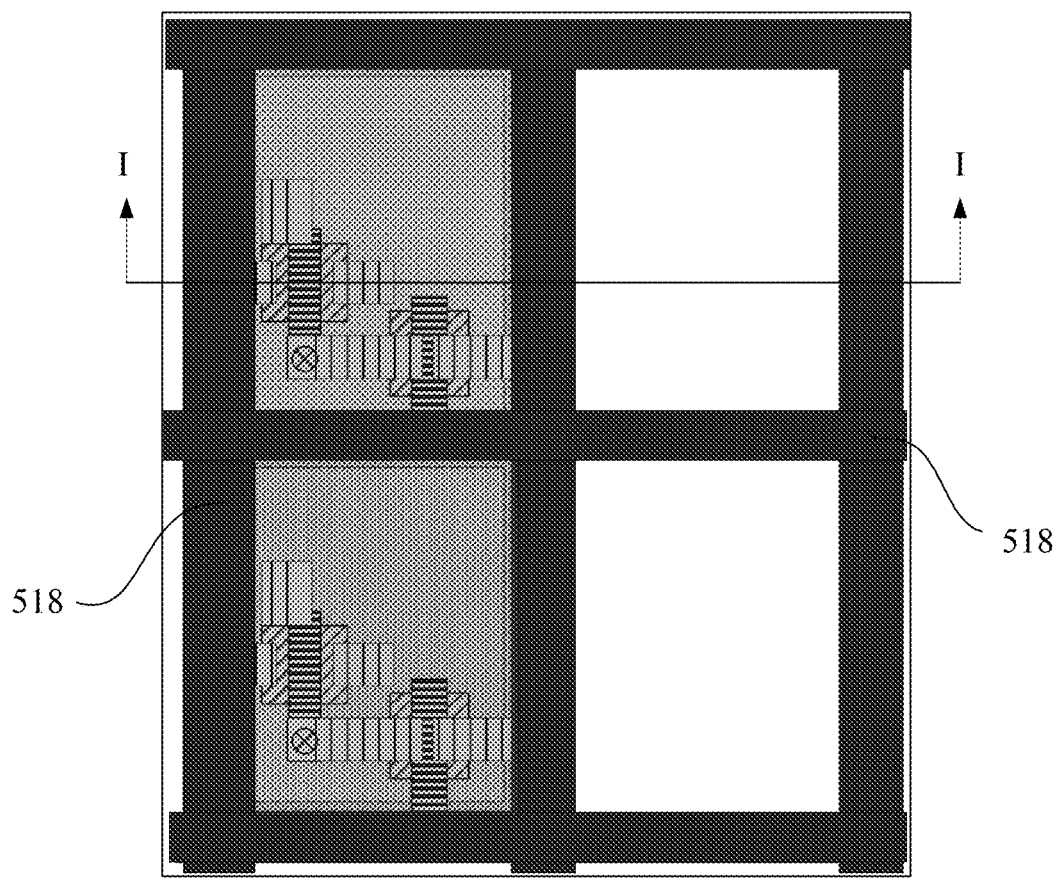
FIG. 26 is a schematic diagram of forming a pixel defining layer in a fabrication method of the OLED array substrate according to an embodiment of the present disclosure.

For example, as illustrated in FIG. 13 and FIG. 14, a common spacer layer 540 is formed in a pixel area MP of a base substrate 500; and in order to reduce the number of masks in a fabrication process, as illustrated in FIG. 26, the common spacer layer 540 is located in an area corresponding to a pixel defining layer 518 to be formed, that is, an orthographic projection of the common spacer layer 540 on the base substrate 500 is located in an orthographic projection of the pixel defining layer 518 on the base substrate 500; then, as illustrated in FIG. 15 and FIG. 16, a common light-shielding layer 542 is formed on the common spacer layer 540, and a common groove 530 is formed in the common light-shielding layer 542; and finally, the common light-shielding portion 502 is formed on the base substrate 500. For specific materials and preparation methods of the spacer layer and the light-shielding layer, the description in the foregoing embodiments may be referred to.

S302: forming a buffer layer and an active layer in both the at least one pixel area and the at least one non-pixel area.

For example, as illustrated in FIG. 17 to FIG. 19, a buffer layer 503 is simultaneously formed in the pixel area MP and the non-pixel area NP; and then, three active layers 504, 604, 704 are simultaneously formed on the buffer layer 503. The active layer 504 is an active layer of a drive transistor T1, the active layer 604 is an active layer of a switch transistor T2, and the two are both located in a same pixel area. The active layer 704 is located in the non-pixel area. For example, the active layers 504, 604, 704 are formed by using a patterning process. The active layer 704 in the non-pixel area is removed together while a first electrode 516 of an organic light-emitting diode component is subsequently patterned. Before that, the active layer 704 is reserved to prevent a rough interface caused by etching an insulating layer above the active layer. For example, as illustrated in FIG. 17, while forming the active layers 504, 604 and 704, step S302 further includes: forming a first electrode plate 804. For example, the first electrode plate 804 is made of a same material as the active layer, and is used for forming a storage capacitor. For example, the first electrode plate 804 may be made of an oxide semiconductor or a low-temperature polysilicon material. For example, the first electrode plate 804 and the active layers 504, 604 are located in a same common groove, which can prevent light from being incident onto a bottom portion or a side surface of the first electrode plate 804.

S303: forming a gate insulating layer, a gate electrode and a gate line in the at least one pixel area.

In this embodiment, description is provided with fabrication of the drive transistor T1 as an example; because a configuration of the switch transistor T2 is the same as that of the drive transistor T1, it will be omitted in the description below in order to avoid redundancy or confusion.

Figure 20:
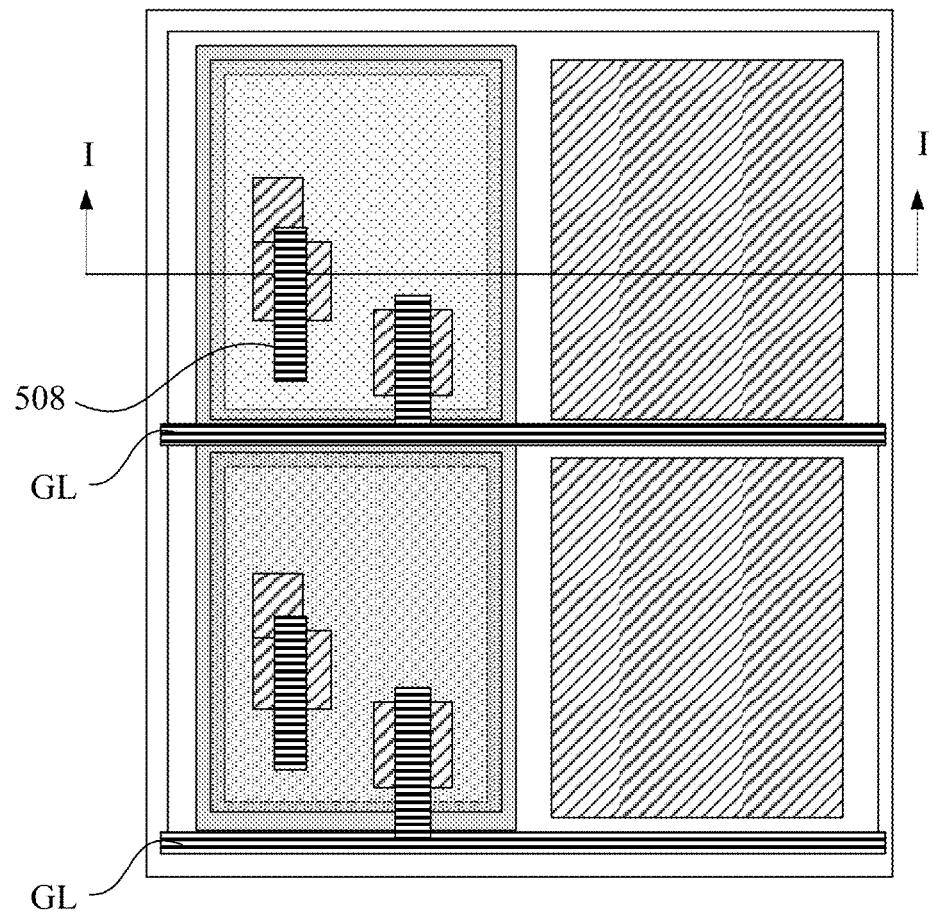
FIG. 20 is a schematic diagram of forming a gate electrode in a fabrication method of the OLED array substrate according to an embodiment of the present disclosure.
Figure 21:
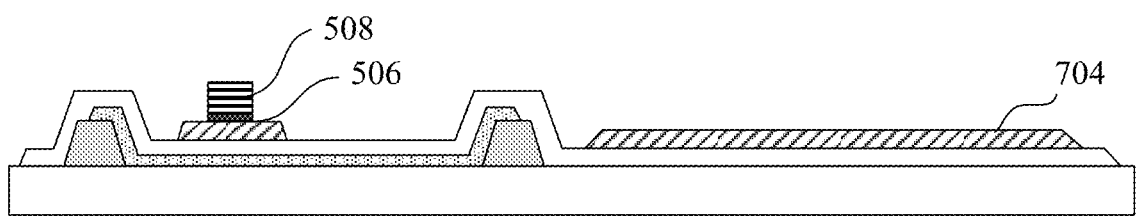
FIG. 21 is a cross-sectional view taken along line I-I of FIG. 20.

For example, as illustrated in FIG. 20 and FIG. 21, a gate insulating layer 506, a gate electrode 508 and a gate line GL of the drive transistor T1 are formed in the pixel area MP.

In step S303, for example, the forming a gate insulating layer includes: forming a gate insulating thin film to overlay at least one pixel area and at least one non-pixel area; and patterning the gate insulating thin film to form a gate insulating layer located in at least one pixel area, herein, the gate insulating thin film has a portion located in the at least one non-pixel area, and the portion of the gate insulating thin film is removed while the gate insulation thin film is patterned.

In step S303, for example, the forming a gate electrode includes: after forming the gate insulating layer, forming a gate electrode thin film on the gate insulating layer to overlay at least one pixel area and at least one non-pixel area; and patterning the gate electrode thin film to form the gate electrode located in at least one pixel area, herein, the gate electrode thin film has a portion located in the at least one non-pixel area, and the portion of the gate electrode thin film is removed while the gate electrode thin film is patterned.

S304: forming a source electrode, a drain electrode and a data line on the gate electrode in the at least one pixel area.

Figure 23:
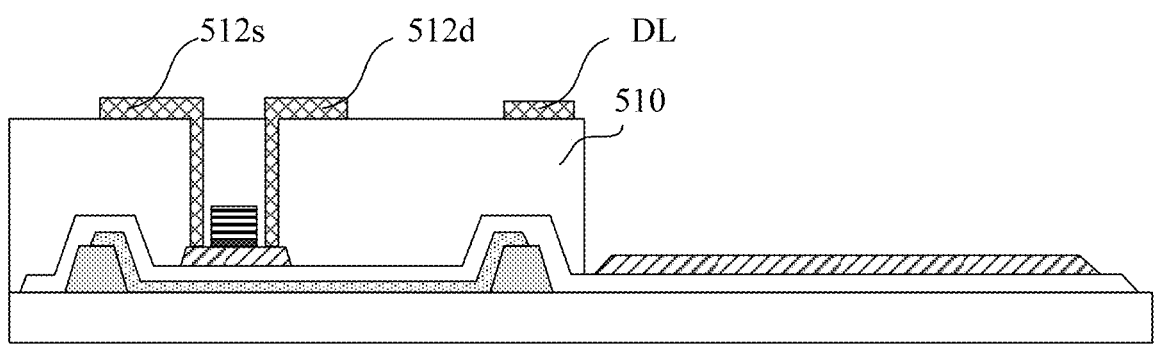
FIG. 23 is a cross-sectional view taken along line I-I of FIG. 22.

For example, as illustrated in FIG. 22 and FIG. 23, a first dielectric layer 510 is formed on the gate electrode 508 of the pixel area MP; then, two contact holes are formed in the first dielectric layer 510; next, a source electrode 512s, a drain electrode 512d and a data line DL of the drive transistor T1 are formed on the first dielectric layer 510, herein, the source electrode 512s is connected with a source area of the active layer 504 through one of the two contact holes, and the drain electrode 512d is connected with a drain area of the active layer 504 through the other contact hole. A channel area is formed between the source area and the drain area. For example, while forming the source electrode 512s, the drain electrode 512d and the data line DL, step S304 further includes: forming a second electrode plate 812. For example, the second electrode plate 812 and the first electrode plate 804 together form a storage capacitor; and an insulating layer between the two is an intermediate dielectric layer.

In step S304, for example, the forming a source electrode and a drain electrode includes: after forming the gate electrode, forming a source-drain electrode thin film to overlay at least one pixel area and at least one non-pixel area; and patterning the source-drain electrode thin film to form the source electrode and the drain electrode located in at least one pixel area, herein, the source-drain electrode thin film has a portion located in at least one non-pixel area, and the portion of the source-drain electrode thin film is removed while the source-drain electrode thin film is patterned.

S305: forming an organic light-emitting diode component on the source electrode and the drain electrode in the at least one pixel area.

For example, the forming an organic light-emitting diode component includes: forming a first electrode, a pixel defining layer, an organic functional layer and a second electrode, herein, an orthographic projection of the spacer layer on the base substrate is located in an orthographic projection of the pixel defining layer on the base substrate.

Figure 24:
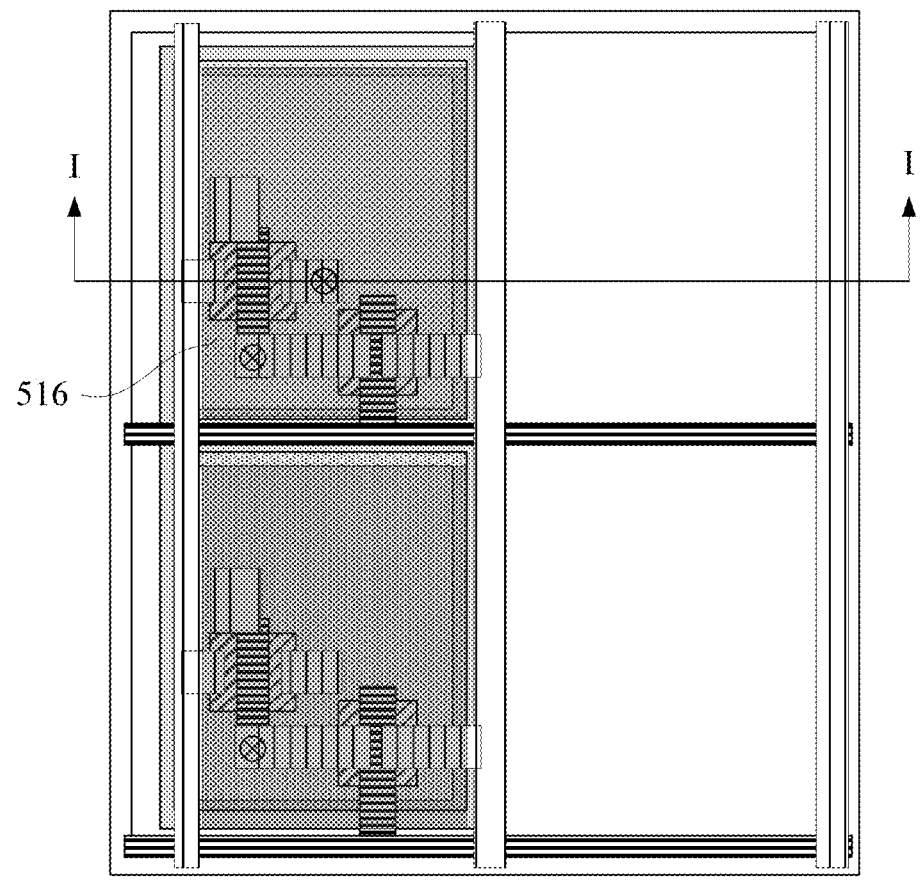
FIG. 24 is a schematic diagram of forming a first electrode in a fabrication method of the OLED array substrate according to an embodiment of the present disclosure.
Figure 25:
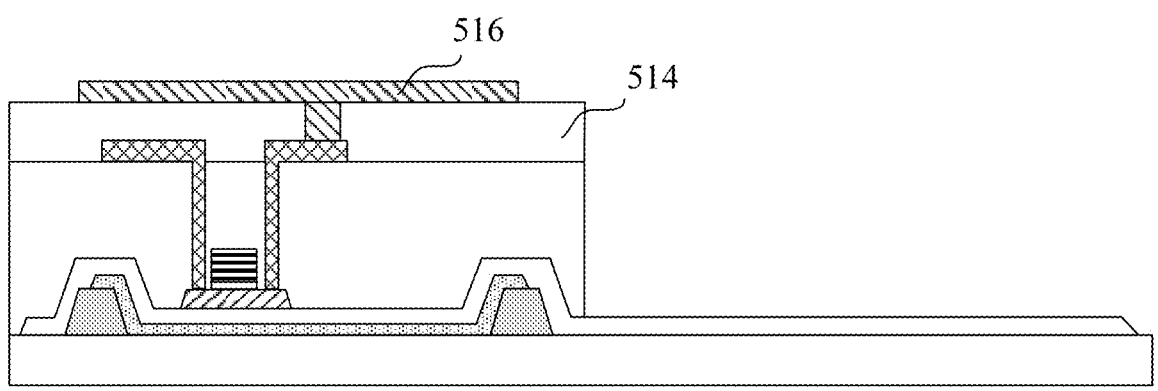
FIG. 25 is a cross-sectional view taken along line I-I of FIG. 24.

For example, as illustrated in FIG. 24 and FIG. 25, a second dielectric layer 514 and the first electrode 516 are formed on the source electrode 512s and the drain electrode 512d of the pixel area MP. For example, while the first electrode 516 is formed, the active layer 704 located in the non-pixel area NP is simultaneously removed, such that only the buffer layer 503 is reserved in the non-pixel area NP; next, as illustrated in FIG. 26 and FIG. 27, a pixel defining layer 518 is formed on the first electrode 516, the orthographic projection of the common spacer layer 540 on the base substrate 500 being located in the orthographic projection of the pixel defining layer 518 on the base substrate 500; finally, an organic functional layer 520 and the second electrode 522 are sequentially formed in an opening defined by the pixel defining layer 518, as illustrated in FIG. 28.

In the disclosure, the following should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

Those skilled in the art should understand that the present disclosure can be implemented without one or more of the above-mentioned specific details, or can be implemented with other components, materials, methods, and the like. In other instances, well-known structures, materials, or operations have not been shown or described in detail so as not to obscure aspects of the present disclosure.

What is described above is related to the illustrative embodiments of the disclosure only and not limitative to the scope of the disclosure; the scopes of the disclosure are defined by the accompanying claims.

What is claimed is:

1. A thin film transistor, comprising:
   a base substrate;
   a gate electrode, an active layer, a source electrode and a drain electrode on the base substrate; and
   a light-shielding portion between the active layer and the base substrate, the light-shielding portion comprising a groove, and the active layer being in the groove,
   wherein the light-shielding portion comprises a spacer layer and a light-shielding layer on the spacer layer,
   wherein the spacer layer is configured to define an opening, the opening is a via hole formed in the spacer layer and penetrates the spacer layer,
   wherein the light-shielding layer at least overlays a bottom portion and a side wall of the opening and is in contact with the base substrate.

2. The thin film transistor according to claim 1, wherein a side wall of the groove is on a periphery of the active layer.

3. The thin film transistor according to claim 1, wherein the groove is in the light-shielding layer.

4. The thin film transistor according to claim 3, wherein the spacer layer and the light-shielding layer are made of a same material and integrally formed.

5. The thin film transistor according to claim 1, wherein a distance between a topmost surface of the light-shielding portion that is away from the base substrate and the base substrate is greater than or equal to a distance between a surface of the active layer that is away from the base substrate and the base substrate.

6. A fabrication method of a thin film transistor, comprising:
   providing a base substrate;
   forming a gate electrode, an active layer, a source electrode and a drain electrode on the base substrate;
   forming a light-shielding portion between the active layer and the base substrate, the light-shielding portion comprising a groove, and the active layer being formed in the groove,
   wherein the forming the light-shielding portion between the active layer and the base substrate comprises:
   forming a spacer layer that defines an opening on the base substrate, the opening being a via hole formed in the spacer layer and penetrating the spacer layer; and
   forming a light-shielding layer on the spacer layer, the light-shielding layer overlaying at least a bottom portion and a side wall of the opening and being in contact with the base substrate.

7. The fabrication method according to claim 6, wherein the forming a light-shielding portion between the active layer and the base substrate comprises:
   forming a light-shielding thin film; and
   patterning the light-shielding thin film to form the light-shielding portion comprising the groove, a side wall of the groove being on a periphery of the active layer.

8. The fabrication method according to claim 6, wherein the groove being formed in the light-shielding layer, and the side wall of the opening is on the periphery of the active layer.

9. An array substrate, comprising the thin film transistor according to claim 1.

10. The array substrate according to claim 9, further comprising: a plurality of gate lines and a plurality of data lines on the base substrate, wherein the plurality of gate lines and the plurality of data lines intersect with each other to define a plurality of sub-areas, and the plurality of sub-areas comprise at least one pixel area provided with the thin film transistor;
    the thin film transistor comprises a first thin film transistor and a second thin film transistor, the first thin film transistor comprises a first active layer and a common light-shielding portion located between the first active layer and the base substrate, the common light-shielding portion comprises a common groove; the second thin film transistor comprises a second active layer; the common light-shielding portion extends between the second active layer and the base substrate, such that the first active layer and the second active layer are both in the common groove.

11. The array substrate according to claim 10, wherein a side wall of the common groove is on a periphery of both the first active layer and the second active layer.

12. The array substrate according to claim 10, wherein the at least one pixel area is further provided with an organic light-emitting diode component; the organic light-emitting diode component comprises a first electrode, a second electrode, and a pixel defining layer between the first electrode and the second electrode; and the pixel defining layer is configured to separate adjacent two organic light-emitting diode components; the side wall of the common groove is in an area corresponding to the pixel defining layer, such that an orthographic projection of the common light-shielding portion on the base substrate at least partially overlaps an orthographic projection of the pixel defining layer on the base substrate.

13. The array substrate according to claim 12, wherein the common light-shielding portion comprises a common spacer layer and a common light-shielding layer on the common spacer layer; the common groove is formed in the common light-shielding layer; an orthographic projection of the common spacer layer on the base substrate is located in the orthographic projection of the pixel defining layer on the base substrate.

14. The array substrate according to claim 10, wherein the plurality of sub-areas further comprise at least one non-pixel area, and the at least one non-pixel area is provided only with a buffer layer.

15. A fabrication method of an array substrate, comprising:

forming a plurality of gate lines and a plurality of data lines on a base substrate, wherein the plurality of gate lines and the plurality of data lines intersect with each other to define a plurality of sub-areas, and the plurality of sub-areas comprise at least one pixel area and at least one non-pixel area; and forming a first thin film transistor and a second thin film transistor in the at least one pixel area, wherein the first thin film transistor comprises a first active layer and a common light-shielding portion between the first active layer and the base substrate, the common light-shielding portion comprises a common groove, and wherein the second thin film transistor comprises a second active layer, the common light-shielding portion extends between the second active layer and the base substrate, such that the first active layer and the second active layer are both in the common groove.

16. The fabrication method according to claim 15, further comprising: forming an organic light-emitting diode component in the at least one pixel area, wherein the organic light-emitting diode component comprises a first electrode, a second electrode, and a pixel defining layer located between the first electrode and the second electrode, and the pixel defining layer is configured to separate adjacent two organic light-emitting diode components, and wherein a side wall of the common groove is in an area corresponding to the pixel defining layer, such that an orthographic projection of the common light-shielding portion on the base substrate at least partially overlaps an orthographic projection of the pixel defining layer on the base substrate.

17. The fabrication method according to claim 16, wherein the forming the common light-shielding portion comprises:

forming a common spacer layer on the base substrate, an orthographic projection of the common spacer layer on the base substrate being in the orthographic projection of the pixel defining layer on the base substrate;

forming a common light-shielding layer on the common spacer layer; and forming a common groove in the common light-shielding layer.

18. The fabrication method according to claim 16, wherein after the forming the common light-shielding portion, the fabrication method further comprises:

forming a buffer layer simultaneously in the at least one pixel area and the at least one non-pixel area, wherein the first thin film transistor, the second thin film transistor and the organic light-emitting diode component are formed on the buffer layer of the at least one pixel area, and only the buffer layer is reserved in the non-pixel area.

* * * * *